US009794026B2

(12) United States Patent
Barbieri et al.

(10) Patent No.: US 9,794,026 B2
(45) Date of Patent: Oct. 17, 2017

(54) ADAPTIVE DATA INTERFERENCE CANCELLATION

(71) Applicant: QUALCOMM Incorporated, San Diego, CA (US)

(72) Inventors: Alan Barbieri, San Diego, CA (US); Tao Luo, San Diego, CA (US)

(*) Notice: Subject to any disclaimer, the term of this patent is extended or adjusted under 35 U.S.C. 154(b) by 341 days.

(21) Appl. No.: 14/245,155

(22) Filed: Apr. 4, 2014

(65) Prior Publication Data

US 2014/0307569 A1 Oct. 16, 2014

Related U.S. Application Data

(60) Provisional application No. 61/811,626, filed on Apr. 12, 2013.

(51) Int. Cl.
*H04L 1/00* (2006.01)
*H04B 1/10* (2006.01)
(Continued)

(52) U.S. Cl.
CPC ........ *H04L 1/005* (2013.01); *H03M 13/3746* (2013.01); *H03M 13/3784* (2013.01);
(Continued)

(58) Field of Classification Search
CPC ..... H04B 1/123; H04B 1/1027; H04J 11/004; H04J 11/0043; H04J 11/005
See application file for complete search history.

(56) References Cited

U.S. PATENT DOCUMENTS 8,085,719 B2 12/2011 Mishra et al.
2003/0193966 A1 10/2003 Mills
(Continued)

FOREIGN PATENT DOCUMENTS

CN 102045071 A 5/2011
EP 1793507 A1 6/2007

OTHER PUBLICATIONS

Qualcomm, "SIC receivers for NAICS", 3GPP TSG-RAN WG4 #66bis R4-131826, Apr. 15-19, 2013, pp. 1-6.*
(Continued)

*Primary Examiner* — Scott M Sciacca
(74) *Attorney, Agent, or Firm* — Holland & Hart LLP

(57) ABSTRACT

Real-time selection of interference cancellation schemes based on transmission parameters and amount of resource overlap between the desired payload and the interfering payload. Codeword level interference cancellation may be performed where the signal quality of the interfering signal indicates that the interfering payload will be decoded correctly. When performed, codeword level interference cancellation may be monitored to determine if decoding the interfering payload is converging. Other interference cancellation schemes may be selected based on the signal quality of the interfering signal or non-converging decode of the interfering payload. The number of iterations for iterative decoding in codeword level interference cancellation may be dynamically selected. The decoder output (e.g., soft bits) may be used to perform interference cancellations before the decoder is fully converged. Iterative decoding may be performed in multiple passes and soft decision output form one pass may be used to initialize the decoder for a subsequent pass.

29 Claims, 18 Drawing Sheets

(51) Int. Cl.
    *H04L 5/00*          (2006.01)
    *H04W 24/02*       (2009.01)
    *H04J 11/00*       (2006.01)
    *H03M 13/37*      (2006.01)
    *H04W 84/04*      (2009.01)

(52) U.S. Cl.
    CPC ........... *H04J 11/004* (2013.01); *H04J 11/005* (2013.01); *H04J 11/0043* (2013.01); *H04L 1/0048* (2013.01); *H04L 5/0032* (2013.01); *H04W 24/02* (2013.01); *H04W 84/045* (2013.01)

(56) References Cited

U.S. PATENT DOCUMENTS

| | | | |
|---|---|---|---|
| 2005/0154957 A1* | 7/2005 | Jacobsen | H03M 13/1114 714/752 |
| 2007/0147329 A1* | 6/2007 | Soriaga | H04B 1/71072 370/342 |
| 2008/0168326 A1 | 7/2008 | Hwang et al. | |
| 2011/0002365 A1* | 1/2011 | Khayrallah | H04B 1/71072 375/148 |
| 2011/0087933 A1* | 4/2011 | Varnica | H03M 13/112 714/704 |
| 2011/0182236 A1 | 7/2011 | Matsumoto et al. | |
| 2012/0033715 A1* | 2/2012 | Nammi | H04B 1/71072 375/148 |
| 2012/0189083 A1 | 7/2012 | Reial | |
| 2013/0044697 A1* | 2/2013 | Yoo | H04W 72/082 370/329 |
| 2013/0196701 A1* | 8/2013 | Tiirola | H04J 11/0026 455/501 |

OTHER PUBLICATIONS

ISA/EPO, International Search Report and Written Opinion of the International Searching Authority, Int'l App. No. PCT/US2014/033150, Oct. 29, 2014, European Patent Office, Rijswijk, NL, 17 pgs.

ISA/EPO, Partial International Search Report of the International Searching Authority, Int'l App. No. PCT/US2014/033150, Aug. 11, 2014, European Patent Office, Rijswijk, NL, 6 pgs.

* cited by examiner

ADAPTIVE DATA INTERFERENCE CANCELLATION

CROSS REFERENCES

The present Application for Patent claims priority to U.S. Provisional Patent Application No. 61/811,626 by Barbieri et al., entitled "Methods to Enable and Enhance Data Interference Cancellation," filed Apr. 12, 2013, assigned to the assignee hereof, and expressly incorporated by reference herein.

BACKGROUND

Wireless communication networks are widely deployed to provide various communication services such as voice, video, packet data, messaging, broadcast, and the like. These wireless networks may be multiple-access networks capable of supporting multiple users by sharing the available network resources.

A wireless communication network may include a number of base stations that can support communication for a number of mobile devices. In some technologies, mobile devices may be called access terminals, user equipments (UEs), mobile stations, and the like. A mobile device may communicate with a base station via downlink (DL) and uplink (UL) transmissions. The downlink (or forward link) refers to the communication link from the base station to the mobile device, and the uplink (or reverse link) refers to the communication link from the mobile device to the base station. Each base station has a coverage range, which may be referred to as the coverage area of the cell. Networks may include cells of different power classes to serve different and potentially overlapping coverage areas. For example, a macrocell is used to describe a cell serving a wide region such as rural, suburban, and urban areas. Smaller cells may be deployed in homes, small businesses, buildings, or other limited regions. These small cells fall into different classes such as picocells or femtocells. Picocells may be connected to a service provider's network or a macrocell via a direct backhaul. Femtocells are often connected to a service provider's network via broadband connections or other mediums.

Mobile devices may experience interference from transmissions to and from other cells and mobile devices in the network. On the downlink, inter-cell interference may occur at a mobile device due to transmissions from other cells and mobile devices served by the other cells. Intra-cell interference to a mobile device may occur due to transmissions to and from other mobile devices by the serving cell of the mobile device. Similarly, base stations may experience interference on uplink transmissions from mobile devices. Mobile devices and base stations may include capabilities for advanced interference management including interference cancellation (IC). Some interference cancellation techniques depend on identifying various parameters used for transmission of the interfering signal and using these parameters to estimate the received signal and reconstruct the transmitted interfering signal for interference cancellation. While these techniques can provide superior interference cancellation performance in some circumstances, challenges may arise in determining when to apply these techniques and how to manage the use of multiple interference cancellation techniques.

SUMMARY

The described features generally relate to one or more improved systems, methods, and/or apparatuses for adaptive interference cancellation in accordance with various embodiments. In some embodiments, a real-time determination of the IC scheme may be employed based on transmission parameters for interfering payloads. The transmission parameters may be used to calculate a signal quality threshold above which various IC schemes are likely to be successful. For example, the signal quality threshold may indicate a level at which an error correcting code structure based IC scheme is likely to be successful. If selected, the error correcting code structure based IC scheme may be monitored to determine if decoding the interfering payload will be successful or not. If, based on a convergence metric associated with decoding the interfering transmission, the error correcting code structure based IC appears to be non-converging, the error correcting code structure based IC may be stopped and a different IC scheme may be run instead. Other IC schemes that may be employed based on the signal quality threshold include, for example, no interference cancellation, spatial interference rejection based on linear equalization, or a coding structure independent interference cancellation scheme.

In some embodiments, the amount of resource overlap between the desired payload and the interfering payload is taken into account in determining the IC scheme and/or order of performing interference cancellation for interfering payloads. For example, multiple interfering signals may be received including interfering payloads with varying levels of resource overlap with the desired payload. Error correcting code structure based IC may be performed on some or all interfering payloads based on the amount of overlap and processing constraints. Selection and ordering of the interfering payloads for performing error correcting code structure based IC may depend on the amount of resource overlap or signal energy overlap of the interfering payloads with the desired payload. Selection and ordering may also depend on the probability of successful decoding of the interfering payloads.

When performing error correcting code structure based IC, the number of iterations for iterative decoding of interfering payloads may be dynamically selected. In some embodiments, the decoder output (e.g., soft bits) may be used to perform interference cancellation before the decoder is fully converged. Optimization of decode iterations may be based on signal quality of the interfering payloads, code rate, residual interference, signal quality of the serving cell transmission, and/or extrinsic information produced by the decoder. In some embodiments, iterative decoding may be performed multiple times for one interfering payload. The soft decision output may be stored for the first pass and the iterative decoder may be initialized with the stored soft decision output of the first pass on subsequent passes.

Some embodiments are directed to a method including receiving a signal comprising a serving cell transmission and one or more interfering transmissions, identifying a transmission parameter for a first interfering transmission of the one or more interfering transmissions, calculating a signal quality threshold associated with the first interfering transmission based at least in part on the identified transmission parameter, determining a signal quality metric of the first interfering transmission, and determining an interference cancellation scheme for the first interfering transmission based at least in part on the signal quality threshold and the signal quality metric of the first interfering transmission. The one or more interfering transmissions may be one or more of an interfering neighboring cell transmission or an interfering serving cell transmission. The signal quality threshold may be a signal to interference plus noise ratio (SINR) threshold, and the signal quality metric may be a SINR of the first interfering transmission. The interference cancellation scheme may be, for example, spatial interference rejection based on linear equalization, an error correcting code structure based interference cancellation scheme, or a coding structure independent interference cancellation scheme, or a combination thereof.

In some embodiments, the method includes determining an amount of resource overlap of the serving cell transmission and the first interfering transmission. The interference cancellation scheme may be determined based at least in part on the determined amount of resource overlap. In some embodiments, the method includes performing codeword-level interference cancellation (CWIC) for the first interfering transmission based on the signal quality metric of the first interfering transmission exceeding the signal quality threshold. Performing CWIC for the first interfering transmission may include performing iterative decoding of the first interfering transmission, monitoring a convergence metric of the iterative decoding, determining a convergence estimate based at least in part on the convergence metric and a number of iterations of the iterative decoding, and discontinuing CWIC of the first interfering transmission when the convergence estimate indicates that the iterative decoding is not converging. The method may include performing symbol-level interference cancellation (SLIC) for the first interfering transmission after discontinuing CWIC. Iterative decoding may include turbo decoding of the first interfering transmission. The convergence metric may be based on log-likelihood ratios calculated during the iterative decoding.

In some embodiments, the method includes performing SLIC for the first interfering transmission based on the signal quality metric of the first interfering transmission not exceeding the signal quality threshold. The method may include performing no interference cancellation for the first interfering transmission based on the signal quality metric of the first interfering transmission not exceeding a second signal quality threshold. Identifying the transmission parameter for the first interfering transmission may include receiving the transmission parameter at a UE in a control message intended for the UE, blind decoding of downlink control information (DCI) associated with the first interfering transmission, or a combination thereof. The transmission parameter may be, for example, a code rate of the first interfering transmission, a spatial scheme of the first interfering transmission, a rank of transmissions associated with the first interfering transmission, a transport block size of the first interfering transmission, a redundancy version of the first interfering transmission, or a combination thereof. The received signal may be a plurality of symbols received over a plurality of subcarriers in a predetermined time period. The received signal may include symbols received in a subframe associated with the serving cell transmission.

In some embodiments, the method includes detecting a second interfering transmission of the one or more interfering transmissions, determining an order for performing interference cancellation for the first and the second interfering transmissions, and performing CWIC for one of the first or the second interfering transmissions based on the determined order. Determining the order for performing interference cancellation for the first and the second interfering transmissions may include determining a first amount of overlapping resources of the first interfering transmission with the serving cell transmission, determining a second amount of overlapping resources of the second interfering transmission with the serving cell transmission, and comparing the first amount of overlapping resources with the second amount of overlapping resources. Determining the order for performing interference cancellation for the first and the second interfering transmissions may include determining a first amount of overlapping signal energy of the first interfering transmission with the serving cell transmission, determining a second amount of overlapping signal energy of the second interfering transmission with the serving cell transmission, and comparing the first amount of overlapping signal energy with the second amount of overlapping signal energy. Determining the order for performing interference cancellation for the first and the second interfering transmissions may be based on an estimated probability of successfully decoding the first and the second interfering transmissions. In some embodiments, performing CWIC corresponds to a portion of resources of the serving cell transmission. The method may include performing a different interference cancellation scheme on a remaining portion of the resources of the serving cell transmission.

Some embodiments are directed to a method including receiving a signal comprising a serving cell transmission and one or more interfering transmissions, determining a number of iterations for iterative decoding of an interfering transmission of the one or more interfering transmissions based on one or more iteration parameters, and performing iterative decoding for the interfering transmission for the determined number of iterations. The one or more interfering transmissions may be one or more of an interfering neighboring cell transmission or an interfering serving cell transmission. The method may include producing non-converged interfering transmission soft decision output after the determined number of iterations.

In some embodiments, the method includes generating an estimated encoded interfering transmission based on the non-converged interfering transmission soft-decision output, and cancelling the estimated encoded interfering transmission from the received signal. The method may include storing the non-converged interfering transmission soft-decision output after the determined number of iterations, performing at least one additional transmission cancelling operation on the received signal, and performing additional iterative decoding of the interfering transmission after the at least one additional transmission cancelling operation, wherein soft-decision values are initialized for the additional iterative decoding to the stored non-converged interfering transmission soft-decision output. The at least one additional transmission cancelling operation on the received signal may include performing iterative decoding of the serving cell transmission to produce non-converged serving cell soft-decision output, and cancelling an estimation of the encoded serving cell transmission from the received signal based on the non-converged serving cell soft-decision output.

The non-converged interfering transmission soft-decision output may be log likelihood ratios (LLR) of the iterative decoding of the interfering transmission. The determined number of iterations may be lower than a predetermined number of iterations for reliable decoding. The determined number of iterations may be lower than a number of iterations used for decoding the serving cell transmission. The one or more iteration parameters may be, for example, one a transmission parameter associated with the interfering transmission, a signal metric of the interfering transmission, a signal metric of the serving cell transmission, a signal metric of the received signal, a decoding timing metric, a number of detected interfering transmissions in the received signal, or a convergence metric of the iterative decoding, or a combination thereof. The iterative decoding may include turbo decoding of the interfering transmission. The received signal may include a plurality of symbols received over a plurality of subcarriers in a predetermined time period. Determining the number of iterations for the iterative decoding may be based at least in part on a time period for each iteration and the predetermined time period.

Some embodiments are directed to an apparatus including means for receiving a signal comprising a serving cell transmission and one or more interfering transmissions, means for identifying a transmission parameter for a first interfering transmission of the one or more interfering transmissions, means for calculating a signal quality threshold associated with the first interfering transmission based at least in part on the identified transmission parameter, means for determining a signal quality metric of the first interfering transmission, and means for determining an interference cancellation scheme for the first interfering transmission based at least in part on the signal quality threshold and the signal quality metric of the first interfering transmission. The apparatus may include means for determining an amount of resource overlap of the serving cell transmission and the first interfering transmission, and the interference cancellation scheme may be determined based at least in part on the determined amount of resource overlap.

In some embodiments, the apparatus includes means for performing CWIC for the first interfering transmission based on the signal quality metric of the first interfering transmission exceeding the signal quality threshold. In some embodiments, the means for performing CWIC for the first interfering transmission performs iterative decoding of the first interfering transmission, monitors a convergence metric of the iterative decoding, determines a convergence estimate based at least in part on the convergence metric and a number of iterations of the iterative decoding, and discontinues CWIC of the first interfering transmission when the convergence estimate indicates that the iterative decoding is not converging.

The apparatus may include means for performing SLIC for the first interfering transmission based on the signal quality metric of the first interfering transmission not exceeding the signal quality threshold. In some embodiments, the apparatus includes means for detecting a second interfering transmission of the one or more interfering transmissions, means for determining an order for performing interference cancellation for the first and the second interfering transmissions, and means for performing CWIC for one of the first or the second interfering transmissions based on the determined order. The means for determining the order for performing interference cancellation for the first and the second interfering transmissions may determine the order for performing interference cancellation based on an amount of overlapping resources or an amount of overlapping signal energy of the first and the second interfering transmissions with the serving cell transmission. The means for determining the order for performing interference cancellation for the first and the second interfering transmissions may determine the order for performing interference cancellation based on an estimated probability of successfully decoding the first and the second interfering transmissions.

Some embodiments are directed to an apparatus including means for receiving a signal comprising a serving cell transmission and one or more interfering transmissions, means for determining a number of iterations for iterative decoding of an interfering transmission of the one or more interfering transmissions based on one or more iteration parameters, and means for performing iterative decoding for the interfering transmission for the determined number of iterations. The apparatus may include means for generating an estimated encoded interfering transmission based on non-converged interfering transmission soft-decision output produced after the determined number of iterations, and means for cancelling the estimated encoded interfering transmission from the received signal. The apparatus may include means for storing the non-converged interfering transmission soft-decision output after the determined number of iterations, means for performing at least one additional transmission cancelling operation on the received signal, and means for performing additional iterative decoding of the interfering transmission after the at least one additional transmission cancelling operation, wherein soft-decision values are initialized for the additional iterative decoding to the stored non-converged interfering transmission soft-decision output.

Some embodiments are directed to a computer program product for adaptive interference cancellation including a computer-readable medium including code for receiving a signal comprising a serving cell transmission and one or more interfering transmissions, identifying a transmission parameter for a first interfering transmission of the one or more interfering transmissions, calculating a signal quality threshold associated with the first interfering transmission based at least in part on the identified transmission parameter, determining a signal quality metric of the first interfering transmission, and determining an interference cancellation scheme for the first interfering transmission based at least in part on the signal quality threshold and the signal quality metric of the first interfering transmission.

The computer-readable medium may include code for determining an amount of resource overlap of the serving cell transmission and the first interfering transmission. In some embodiments, the interference cancellation scheme is determined based at least in part on the determined amount of resource overlap. The computer-readable medium may include code for performing CWIC for the first interfering transmission based on the signal quality metric of the first interfering transmission exceeding the signal quality threshold. The computer-readable medium may include code for performing iterative decoding of the first interfering transmission, monitoring a convergence metric of the iterative decoding, determining a convergence estimate based at least in part on the convergence metric and a number of iterations of the iterative decoding, and discontinuing CWIC of the first interfering transmission when the convergence estimate indicates that the iterative decoding is not converging. In some embodiments, the computer-readable medium includes code for detecting a second interfering transmission of the one or more interfering transmissions, determining an order for performing interference cancellation for the first and the second interfering transmissions, and performing codeword-level interference cancellation (CWIC) for one of the first or the second interfering transmissions based on the determined order.

Some embodiments are directed to a computer program product for adaptive interference cancellation including a computer-readable medium including code for receiving a signal comprising a serving cell transmission and one or more interfering transmissions, determining a number of iterations for iterative decoding of an interfering transmission of the one or more interfering transmissions based on one or more iteration parameters, and performing iterative decoding for the interfering transmission for the determined number of iterations. The computer-readable medium may include code for generating an estimated encoded interfering transmission based on non-converged interfering transmission soft-decision output produced after the determined number of iterations and cancelling the estimated encoded interfering transmission from the received signal. The computer-readable medium may include code for storing the non-converged interfering transmission soft-decision output after the determined number of iterations, performing at least one additional transmission cancelling operation on the received signal, and performing additional iterative decoding of the interfering transmission after the at least one additional transmission cancelling operation, wherein soft-decision values are initialized for the additional iterative decoding to the stored non-converged interfering transmission soft-decision output.

Some embodiments are directed to a device for performing adaptive interference cancellation including a processor and a memory in electronic communication with the processor. The memory may include instructions being executable by the processor to receive a signal comprising a serving cell transmission and one or more interfering transmissions, identify a transmission parameter for a first interfering transmission of the one or more interfering transmissions, calculate a signal quality threshold associated with the first interfering transmission based at least in part on the identified transmission parameter, determine a signal quality metric of the first interfering transmission, and determine an interference cancellation scheme for the first interfering transmission based at least in part on the signal quality threshold and the signal quality metric of the first interfering transmission.

In some embodiments, the memory includes instructions being executable by the processor to determine an amount of resource overlap of the serving cell transmission and the first interfering transmission. The interference cancellation scheme may be determined based at least in part on the determined amount of resource overlap. In some embodiments, the memory includes instructions being executable by the processor to perform CWIC for the first interfering transmission based on the signal quality metric of the first interfering transmission exceeding the signal quality threshold. The memory may include instructions being executable by the processor to perform iterative decoding of the first interfering transmission, monitor a convergence metric of the iterative decoding, determine a convergence estimate based at least in part on the convergence metric and a number of iterations of the iterative decoding, and discontinue CWIC of the first interfering transmission when the convergence estimate indicates that the iterative decoding is not converging.

In some embodiments, the memory includes instructions being executable by the processor to perform SLIC for the first interfering transmission based on the signal quality metric of the first interfering transmission not exceeding the signal quality threshold. The memory may include instructions being executable by the processor to detect a second interfering transmission of the one or more interfering transmissions, determine an order for performing interference cancellation for the first and the second interfering transmissions, and perform CWIC for one of the first or the second interfering transmissions based on the determined order. The determined order for performing interference cancellation may be based on an amount of overlapping resources or an amount of overlapping signal energy of the first and the second interfering transmissions with the serving cell transmission. The determined order for performing interference cancellation for the first and the second interfering transmissions may be based on an estimated probability of successfully decoding the first and the second interfering transmissions.

Some embodiments are directed to a device for performing adaptive interference cancellation including a processor and a memory in electronic communication with the processor. The memory may include instructions being executable by the processor to receive a signal comprising a serving cell transmission and one or more interfering transmissions, determine a number of iterations for iterative decoding of an interfering transmission of the one or more interfering transmissions based on one or more iteration parameters, and perform iterative decoding for the interfering transmission for the determined number of iterations. The memory may include instructions being executable by the processor to generate an estimated encoded interfering transmission based on non-converged interfering transmission soft-decision output produced after the determined number of iterations, and cancel the estimated encoded interfering transmission from the received signal. The memory may include instructions being executable by the processor to store the non-converged interfering transmission soft-decision output after the determined number of iterations, perform at least one additional transmission cancelling operation on the received signal, and perform additional iterative decoding of the interfering transmission after the at least one additional transmission cancelling operation, wherein soft-decision values are initialized for the additional iterative decoding to the stored non-converged interfering transmission soft-decision output.

BRIEF DESCRIPTION OF THE DRAWINGS

A further understanding of the nature and advantages of the present invention may be realized by reference to the following drawings. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Figure 1:
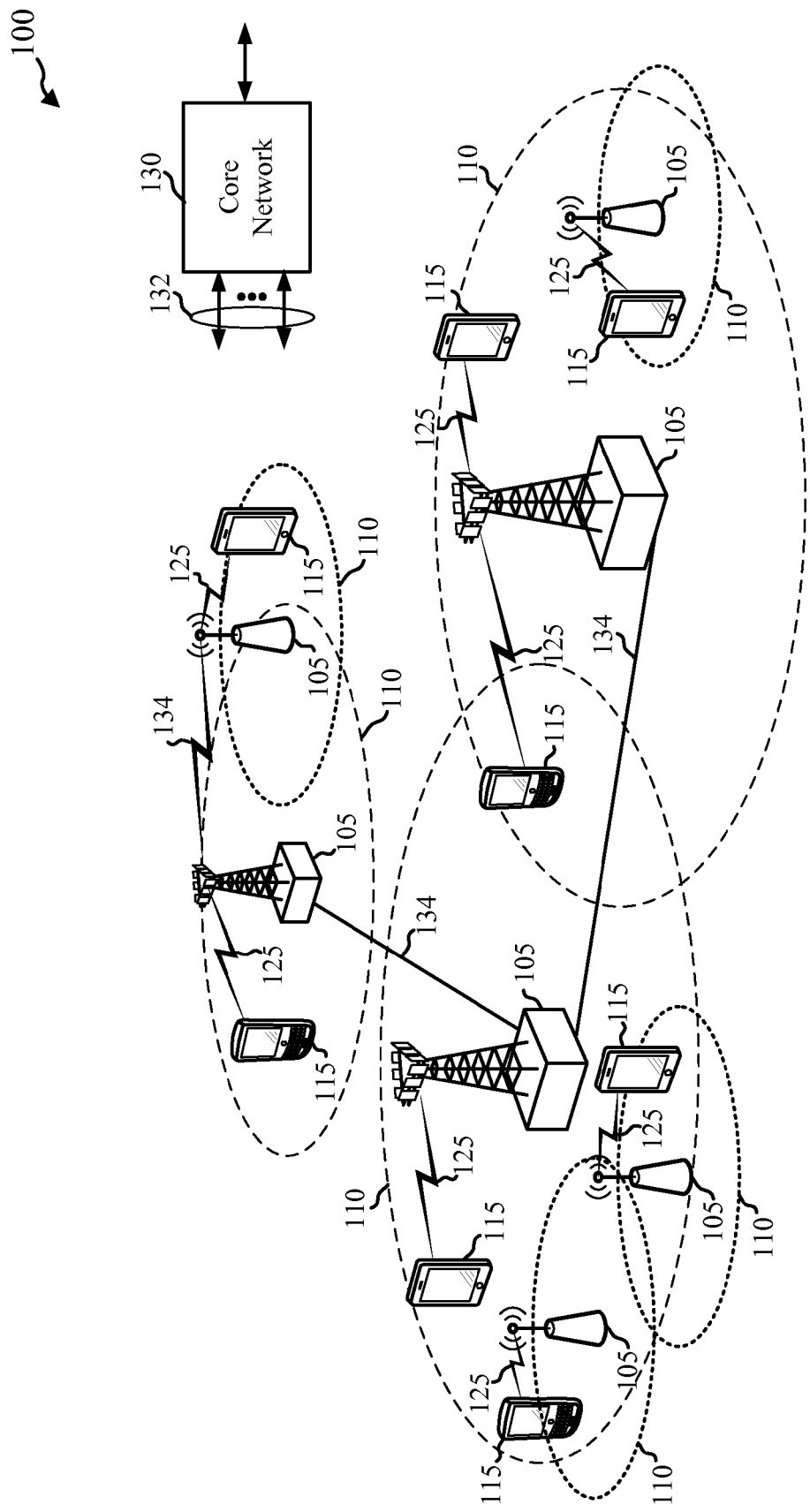
FIG. 1 is a diagram illustrating an example of a wireless communications system in accordance with various embodiments.

Various aspects of the disclosure provide adaptive interference cancellation in accordance with various embodiments. In some embodiments, a real-time determination of the IC scheme may be employed based on transmission parameters for interfering payloads. The transmission parameters may be used to calculate a signal quality threshold above which various IC schemes are likely to be successful. For example, the signal quality threshold may indicate a level at which an error correcting code structure based IC scheme is likely to be successful. If selected, the error correcting code structure based IC scheme may be monitored to determine if decoding the interfering payload will be successful or not. If, based on a convergence metric associated with decoding the interfering transmission, the error correcting code structure based IC appears to be non-converging, the error correcting code structure based IC may be stopped and a different IC scheme may be run instead. Other IC schemes that may be employed based on the signal quality threshold include, for example, no interference cancellation, spatial interference rejection based on linear equalization, or a coding structure independent interference cancellation scheme.

In some embodiments, the amount of resource overlap between the desired payload and the interfering payload is taken into account in determining the IC scheme and/or order of performing interference cancellation for interfering payloads. For example, multiple interfering signals may be received including interfering payloads with varying levels of resource overlap with the desired payload. Error correcting code structure based IC may be performed on some or all interfering payloads based on the amount of overlap and processing constraints. Selection and ordering of the interfering payloads for performing error correcting code structure based IC may depend on the amount of resource overlap or signal energy overlap of the interfering payloads with the desired payload. Selection and ordering may also depend on the probability of successful decoding of the interfering payloads.

When performing error correcting code structure based IC, the number of iterations for iterative decoding of interfering payloads may be dynamically selected. In some embodiments, the decoder output (e.g., soft bits) may be used to perform interference cancellation before the decoder is fully converged. Optimization of decode iterations may be based on signal quality of the interfering payloads, code rate, residual interference, signal quality of the serving cell transmission, and/or extrinsic information produced by the decoder. In some embodiments, iterative decoding may be performed multiple times for one interfering payload. The soft decision output may be stored for the first pass and the iterative decoder may be initialized with the stored soft decision output of the first pass on subsequent passes.

Techniques described herein may be used for various wireless communications systems such as cellular wireless systems, Peer-to-Peer wireless communications, wireless local access networks (WLANs), ad hoc networks, satellite communications systems, and other systems. The terms "system" and "network" are often used interchangeably. These wireless communications systems may employ a variety of radio communication technologies such as Code Division Multiple Access (CDMA), Time Division Multiple Access (TDMA), Frequency Division Multiple Access (FDMA), Orthogonal FDMA (OFDMA), Single-Carrier FDMA (SC-FDMA), and/or other radio technologies. Generally, wireless communications are conducted according to a standardized implementation of one or more radio communication technologies called a Radio Access Technology (RAT). A wireless communications system or network that implements a Radio Access Technology may be called a Radio Access Network (RAN).

Examples of Radio Access Technologies employing CDMA techniques include CDMA2000, Universal Terrestrial Radio Access (UTRA), etc. CDMA2000 covers IS-2000, IS-95, and IS-856 standards. IS-2000 Releases 0 and A are commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. Examples of TDMA systems include various implementations of Global System for Mobile Communications (GSM). Examples of Radio Access Technologies employing OFDM and/or OFDMA include Ultra Mobile Broadband (UMB), Evolved UTRA (E-UTRA), IEEE 802.11 (Wi-Fi), IEEE 802.16 (WiMAX), IEEE 802.20, Flash-OFDM, etc. UTRA and E-UTRA are part of Universal Mobile Telecommunication System (UMTS). 3GPP Long Term Evolution (LTE) and LTE-Advanced (LTE-A) are new releases of UMTS that use E-UTRA. UTRA, E-UTRA, UMTS, LTE, LTE-A, and GSM are described in documents from an organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies.

Thus, the following description provides examples, and is not limiting of the scope, applicability, or configuration set forth in the claims. Changes may be made in the function and arrangement of elements discussed without departing from the spirit and scope of the disclosure. Various embodiments may omit, substitute, or add various procedures or components as appropriate. For instance, the methods described may be performed in an order different from that described, and various steps may be added, omitted, or combined. Also, features described with respect to certain embodiments may be combined in other embodiments. Furthermore, in this specification and claims combinations such as "at least one of A, B, or C," "at least one of A, B, and C," "one or more of A, B, and C," "one or more of A, B, or C," and "A, B, C, or any combination thereof" include any combination of A, B, and/or C, and may include multiples of A, multiples of B, or multiples of C. Specifically, combinations such as "at least one of A, B, or C," "at least one of A, B, and C," "one or more of A, B, and C," "one or more of A, B, or C," and "A, B, C, or any combination thereof" may be A only, B only, C only, A and B, A and C, B and C, or A and B and C, where any such combinations may contain one or more member or members of A, B, or C.

Referring first to FIG. 1, a diagram illustrates an example of a wireless communications system 100. The system 100 includes base stations (or cells) 105, communication devices 115, and a core network 130. The base stations 105 may communicate with the communication devices 115 under the control of a base station controller (not shown), which may be part of the core network 130 or the base stations 105 in various embodiments. Base stations 105 may communicate control information and/or user data with the core network 130 through backhaul links 132. Backhaul links 132 may be wired backhaul links (e.g., copper, fiber, etc.) and/or wireless backhaul links (e.g., microwave, etc.). In embodiments, the base stations 105 may communicate, either directly or indirectly, with each other over backhaul links 134, which may be wired or wireless communication links. The system 100 may support operation on multiple carriers (waveform signals of different frequencies). Multi-carrier transmitters can transmit modulated signals simultaneously on the multiple carriers. For example, each communication link 125 may be a multi-carrier signal modulated according to the various radio technologies described above. Each modulated signal may be sent on a different carrier and may carry control information (e.g., reference signals, control channels, etc.), overhead information, data, etc.

The base stations 105 may wirelessly communicate with the devices 115 via one or more base station antennas. Each of the base station 105 sites may provide communication coverage for a respective coverage area 110. In some embodiments, base stations 105 may be referred to as a base transceiver station, a radio base station, an access point, a radio transceiver, a basic service set (BSS), an extended service set (ESS), a NodeB, eNodeB (eNB), or some other suitable terminology. The coverage area 110 for a base station may be divided into sectors making up only a portion of the coverage area (not shown). The system 100 may include base stations 105 of different types (e.g., macro, pico, femto, or micro base stations). There may be overlapping coverage areas for different technologies.

The communication devices 115 are dispersed throughout the wireless network 100, and each device may be stationary or mobile. A communication device 115 may also be referred to by those skilled in the art as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a user equipment, a mobile client, a client, or some other suitable terminology. A communication device 115 may be a cellular phone, a personal digital assistant (PDA), a wireless modem, a wireless communication device, a handheld device, a tablet computer, a laptop computer, a cordless phone, a wireless local loop (WLL) station, or the like. A communication device may be able to communicate with macro base stations, pico base stations, femto base stations, relay base stations, and the like.

The transmission links 125 shown in network 100 may include uplink (UL) transmissions from a mobile device 115 to a base station 105, and/or downlink (DL) transmissions, from a base station 105 to a mobile device 115. The downlink transmissions may also be called forward link transmissions while the uplink transmissions may also be called reverse link transmissions.

In embodiments, the system 100 is an LTE/LTE-A network. In LTE/LTE-A networks, the terms evolved Node B (eNB) and user equipment (UE) may be generally used to describe the base stations 105 and communication devices 115, respectively. The system 100 may be a Heterogeneous LTE/LTE-A network in which different types of eNBs provide coverage for various geographical regions. For example, each eNB 105 may provide communication coverage for a macrocell, a picocell, a femtocell, or other types of cell. A macrocell generally covers a relatively large geographic area (e.g., several kilometers in radius) and may allow unrestricted access by UEs with service subscriptions with the network provider. Picocells and femtocells would generally cover relatively smaller geographic areas (e.g., a building, a home, and the like). An eNB for a macrocell may be referred to as a macro eNB. An eNB for a picocell may be referred to as a pico eNB, and an eNB for a femtocell may be referred to as a femto eNB or a home eNB. An eNB may support one or multiple (e.g., two, three, four, and the like) cells.

Strategic deployment of picocells and femtocells may be used to mitigate mobile device power consumption, as UEs 115 typically operate using an internal power supply, such as a small battery, to facilitate highly mobile operation. For example, femtocells may be utilized to provide service within areas which might not otherwise experience adequate or even any service (e.g., due to capacity limitations, bandwidth limitations, signal fading, signal shadowing, etc.), thereby allowing UEs 115 to reduce searching times, to reduce transmit power, to reduce transmit times, etc. Thus, where a UE 115 is served by a picocell or femtocell, it is typically located relatively close the serving cell, often allowing the UE 115 to communicate with reduced transmission power.

The communications system 100 according to an LTE/LTE-A network architecture may be referred to as an Evolved Packet System (EPS) 100. The EPS 100 may include one or more UEs 115, an Evolved UMTS Terrestrial Radio Access Network (E-UTRAN), an Evolved Packet Core (EPC) (e.g., core network 130), a Home Subscriber Server (HSS), and an Operator's IP Services. The EPS may interconnect with other access networks using other Radio Access Technologies. For example, EPS 100 may interconnect with a UTRAN-based network and/or a CDMA-based network. To support mobility of UEs 115 and/or load balancing, EPS 100 may support handover of UEs 115 between a source eNB 105 and a target eNB 105. EPS 100 may support intra-RAT handover between eNBs 105 and/or base stations of the same RAT (e.g., other E-UTRAN networks), and inter-RAT handovers between eNBs and/or base stations of different RATs (e.g., E-UTRAN to CDMA, etc.). The EPS 100 may provide packet-switched services, however, as those skilled in the art will readily appreciate, the various concepts presented throughout this disclosure may be extended to networks providing circuit-switched services.

The E-UTRAN may include the eNBs 105 and may provide user plane and control plane protocol terminations toward the UEs 115. Any of the eNBs 105 may be connected to other eNBs 105 via backhaul links 132 or 134 (e.g., an X2 interface, and the like). The eNBs 105 may provide an access point to the EPC 130 for the UEs 115. The eNBs 105 may be connected by backhaul link 132 (e.g., an S1 interface, and the like) to the EPC 130. Logical nodes within EPC 130 may include one or more Mobility Management Entities (MMEs), one or more Serving Gateways, and one or more Packet Data Network (PDN) Gateways (not shown). Generally, the MME may provide bearer and connection management. All user IP packets may be transferred through the Serving Gateway, which itself may be connected to the PDN Gateway. The PDN Gateway may provide UE IP address allocation as well as other functions. The PDN Gateway may be connected to IP networks and/or the operator's IP Services. These logical nodes may be implemented in separate physical nodes or one or more may be combined in a single physical node. The IP Networks/Operator's IP Services may include the Internet, an Intranet, an IP Multimedia Subsystem (IMS), and/or a Packet-Switched (PS) Streaming Service.

The UEs 115 may be configured to collaboratively communicate with multiple eNBs 105 through, for example, Multiple Input Multiple Output (MIMO), Coordinated Multi-Point (CoMP), or other schemes. MIMO techniques use multiple antennas on the base stations and/or multiple antennas on the UE to take advantage of multipath environments to transmit multiple data streams. Each data stream may be called a "layer" and the "rank" of the communication link may indicate the number of layers used for communication. CoMP includes techniques for dynamic coordination of transmission and reception by a number of eNBs to improve overall transmission quality for UEs as well as increasing network and spectrum utilization. Generally, CoMP techniques utilize backhaul links 132 and/or 134 for communication between base stations 105 to coordinate control plane and user plane communications for the UEs 115.

The communication networks that may accommodate some of the various disclosed embodiments may be packet-based networks that operate according to a layered protocol stack. In the user plane, communications at the bearer or Packet Data Convergence Protocol (PDCP) layer may be IP-based. A Radio Link Control (RLC) layer may perform packet segmentation and reassembly to communicate over logical channels. A Medium Access Control (MAC) layer may perform priority handling and multiplexing of logical channels into transport channels. The MAC layer may also use hybrid automatic repeat request (HARQ) techniques to provide retransmission at the MAC layer to ensure reliable data transmission. In the control plane, the Radio Resource Control (RRC) protocol layer may provide establishment, configuration, and maintenance of an RRC connection between the UE and the network used for the user plane data. At the Physical layer, the transport channels may be mapped to Physical channels.

The downlink physical channels may include at least one of a physical broadcast channel (PBCH), a physical downlink control channel (PDCCH), a physical HARQ indicator channel (PHICH), and a physical downlink shared channel (PDSCH). A control format indicator (CFI) carried in a physical control format indicator channel (PCFICH) may indicate the number of symbols in the PDCCH for a particular downlink subframe. The uplink physical channels may include at least one of a physical uplink control channel (PUCCH) and a physical uplink shared channel (PUSCH). The PDCCH may carry downlink control information (DCI), which may indicate data transmissions for UEs on the PDSCH as well as provide UL resource grants to UEs for the PUSCH. The UE may transmit control information in the PUCCH on the assigned resource blocks in the control section. The UE may transmit only data or both data and control information in the PUSCH on the assigned resource blocks in the data section.

LTE/LTE-A utilizes orthogonal frequency division multiple-access (OFDMA) on the downlink and single-carrier frequency division multiple-access (SC-FDMA) on the uplink. An OFDMA and/or SC-FDMA carrier may be partitioned into multiple (K) orthogonal subcarriers, which are also commonly referred to as tones, bins, or the like. Each subcarrier may be modulated with data. The spacing between adjacent subcarriers may be fixed, and the total number of subcarriers (K) may be dependent on the system bandwidth. For example, K may be equal to 72, 180, 300, 600, 900, or 1200 with a subcarrier spacing of 15 kilohertz (KHz) for a corresponding system bandwidth (with guardband) of 1.4, 3, 5, 10, 15, or 20 megahertz (MHz), respectively. The system bandwidth may also be partitioned into sub-bands. For example, a sub-band may cover 1.08 MHz, and there may be 1, 2, 4, 8 or 16 sub-bands. The carriers may transmit bidirectional communications using FDD (e.g., using paired spectrum resources) or TDD operation (e.g., using unpaired spectrum resources). Frame structures for FDD (e.g., frame structure type 1) and TDD (e.g., frame structure type 2) may be defined.

Figure 2:
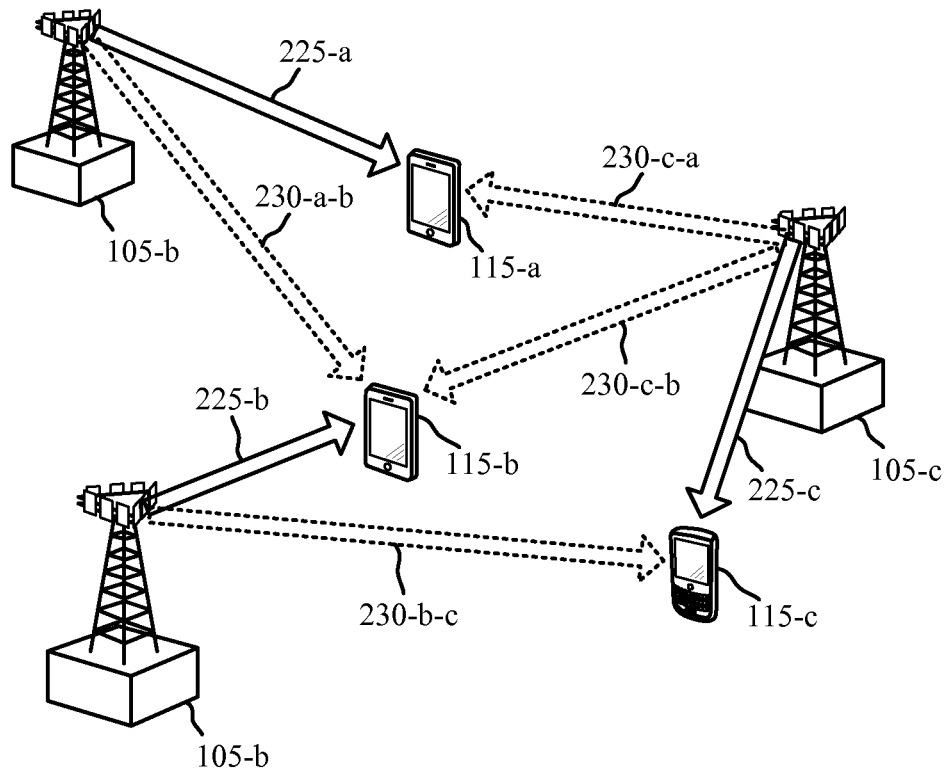
FIG. 2 is diagram of a wireless communications system for adaptive interference cancellation in accordance with various embodiments.

FIG. 2 is diagram of a wireless communications system 200 for adaptive interference cancellation in accordance with various embodiments. System 200 may illustrate, for example, aspects of system 100 illustrated in FIG. 1. System 200 may include eNB 105-$a$, eNB 105-$b$, and eNB 105-$c$ and UE 115-$a$, UE 115-$b$, and UE 115-$d$. System 200 illustrates serving cell transmissions 225 and interfering transmissions 230. For example, UE 115-$a$ may be served by eNB 105-$a$ and serving eNB 105-$a$ may transmit data in transmission 225-$a$ for UE 115-$a$. In system 200, eNB 105-$b$ may transmit data in transmission 225-$b$ to UE 115-$b$ using the same frequency resources as transmission 225-$a$. Transmission 225-$b$ by eNB 105-$b$ may result in interfering transmission 230-$b$-$a$ received by UE 115-$a$. Transmissions 225-$a$, 225-$b$, and 225-$c$ may also result in interfering transmissions 230-$a$-$b$, 230-$c$-$a$, 230-$b$-$c$, and 230-$c$-$b$ to UEs 115-$b$ and 115-$c$. FIG. 2 illustrates downlink serving cell transmissions and interfering transmissions. However, similar interference issues may occur on the uplink for reception of UE transmissions at eNBs 105.

UEs 115 and eNBs 105 may employ various techniques for advanced interference management. These techniques include interference suppression (IS) employing MMSE interference rejection, multi-user detection (MUD) employing joint ML detection for the desired signal and interfering signals, spatial interference rejection based on linear equalization, symbol-level interference cancellation (SLIC), and codeword-level interference cancellation (CWIC).

In SLIC, the most likely transmitted bits of an interfering signal are estimated based on the employed spatial scheme and modulation format. An estimate of the interfering signal is then reconstructed using the estimated bits, spatial scheme, and modulation format, and the estimated interfering signal is then subtracted from the received signal. As used herein, SLIC refers generally to coding structure independent interference cancellation schemes, not limited to a particular transmission type, modulation format, or spatial scheme.

CWIC exploits error-correction coding applied to the interfering data channel in order to estimate the interfering signal for interference cancellation. For example, in LTE the PDSCH is turbo-encoded, where the parameters necessary for decoding are provided to the UE for which the PDSCH payload is intended via DCI in the PDCCH. In CWIC, a UE obtains one or more parameters for decoding an interfering PDSCH transmission intended for a different UE and decodes the interfering PDSCH transmission. The UE then reconstructs the interfering signal from the decoded bits of the PDSCH transmission and subtracts the reconstructed signal from the received signal. Under certain conditions (e.g., reliable turbo decoding, high signal-to-interference plus noise (SINR), etc.), the reconstructed signal can be much more reliable in CWIC than other interference cancellation techniques that do not rely on decoding the interfering transmission (e.g., SLIC, etc.). As used herein, CWIC refers generally to interference cancellation schemes that take the error correcting code structure of the interfering signal into account, and is not limited to a particular encoding technique, transmission type, modulation format, or spatial scheme.

To decode PDSCH payloads for CWIC, the UE uses, for example, the code rate or transport block size (TBS), the physical resource block (PRB) allocation, and the redundancy version (RV). The UE may obtain these transmission parameters via network signaling, blind detection, or decoding of DCI associated with the interfering PDSCH payload. In system environments where the network provides these transmission parameters, UEs receive decoding information for PDSCH payloads intended for other UEs that may cause interference to the UEs. The network could provide this information, for example, in broadcast or control messages.

Blind detection of TBS, PRB allocation, and RV is similar to blind detection of the modulation format and spatial scheme for SLIC. However, blind detection of TBS, PRB allocation, and RV may be computationally intensive because of the number of possible combinations for PDSCH transmissions.

Decoding of DCI intended for other UEs may also be performed by a technique similar to blind decoding. This technique may be less computationally intensive than blind detection of TBS, PRB allocation, and RV. However, blind decoding of DCI intended for other UEs may result in occasional incorrect decoding of resource grants. In these instances, the UE may interpret the DCI as indicating a resource grant for a UE that does not match the actual PDSCH payload. Attempts to perform CWIC using the incorrect resource grant will result in failure to decode the PDSCH payload and may result in CWIC output that is ineffective for interference cancellation or even causes an increase in interference to the desired payload in the received signal.

In embodiments, the different aspects of systems 100 and/or 200 such as UEs 115 and base stations 105 may be configured for employing adaptive interference cancellation in accordance with various embodiments. In some embodiments, a real-time determination of the IC scheme may be employed based on transmission parameters for interfering payloads. The transmission parameters may be used to calculate a signal quality threshold (e.g., SINR threshold, etc.) above which various IC schemes are likely to be successful. For example, the signal quality threshold may indicate a level at which an error correcting code structure based IC scheme (e.g., CWIC, etc.) is likely to be successful. If selected, the error correcting code structure based IC scheme may be monitored to determine if decoding the interfering payload will be successful or not. If, based on a convergence metric associated with decoding the interfering transmission, the error correcting code structure based IC appears be non-converging, the error correcting code structure based IC may be stopped and a different IC scheme may be run instead. Other IC schemes that may be employed based on the signal quality threshold include, for example, no interference cancellation, spatial interference rejection based on linear equalization, or a coding structure independent interference cancellation scheme (e.g., SLIC, etc.).

In some embodiments, the amount of resource overlap between the desired payload and the interfering payload is taken into account in determining the IC scheme and/or order of performing interference cancellation for interfering payloads. For example, multiple interfering signals may be received including interfering payloads with varying levels of resource overlap with the desired payload. Error correcting code structure based IC may be performed on some or all interfering payloads based on the amount of overlap and processing constraints. Selection and ordering of the interfering payloads for performing error correcting code structure based IC may depend on the amount of resource overlap or signal energy overlap of the interfering payloads with the desired payload. Selection and ordering may also depend on the probability of successful decoding of the interfering payloads.

When performing CWIC, the number of iterations for iterative decoding of interfering payloads may be dynamically selected. In some embodiments, the decoder output (e.g., soft bits) may be used to perform interference cancellation before the decoder is fully converged. Optimization of decode iterations may be based on signal quality of the interfering payloads, code rate, residual interference, signal quality of the serving cell transmission, and/or extrinsic information produced by the decoder. In some embodiments, iterative decoding may be performed multiple times for one interfering payload. The soft decision output may be stored for the first pass and the iterative decoder may be initialized with the stored soft decision output of the first pass on subsequent passes.

Figure 3:
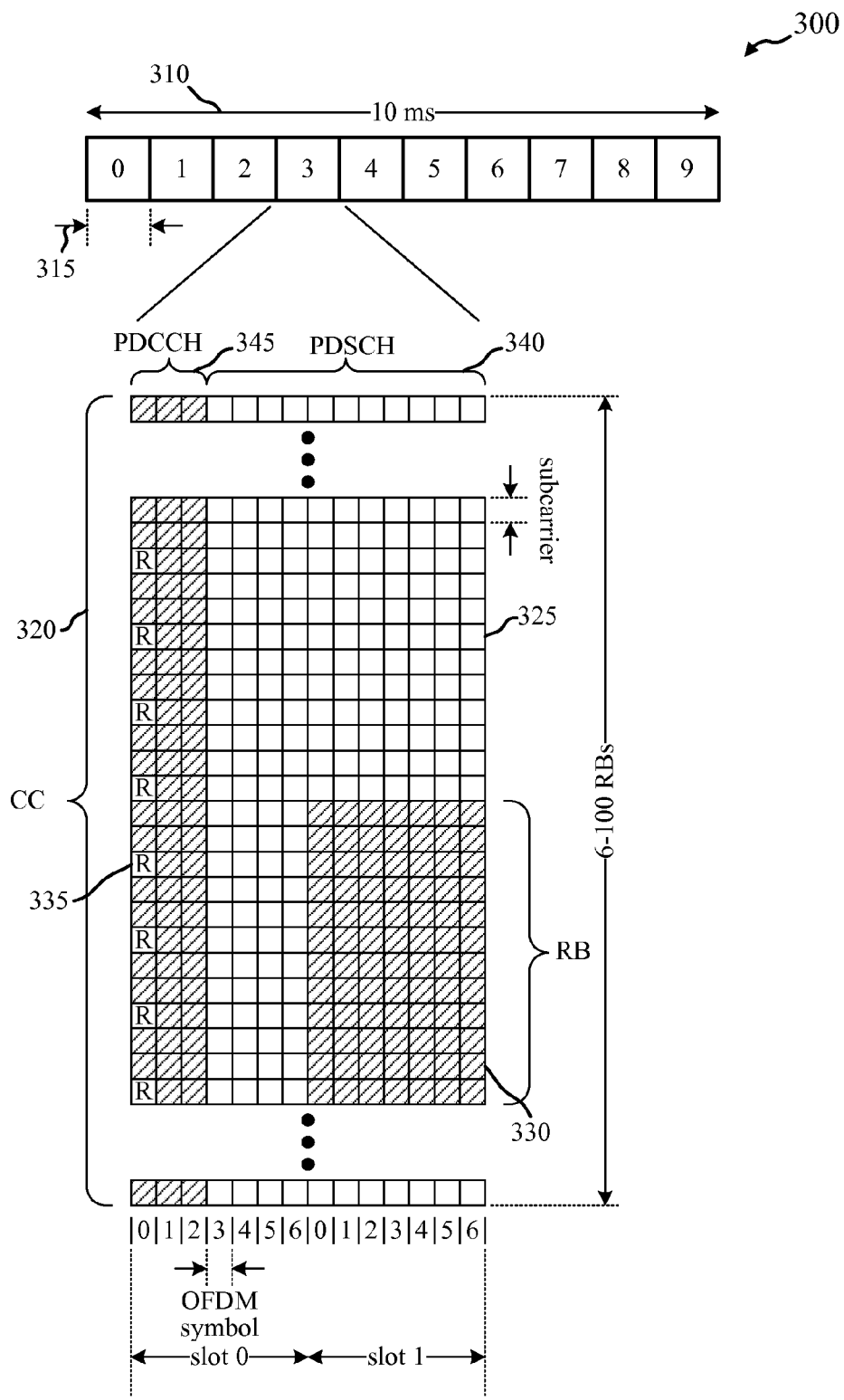
FIG. 3 is a diagram illustrating an example of a downlink frame structure that may be used in a wireless communication system.

FIG. 3 is a diagram illustrating an example of a downlink frame structure 300 that may be used in a wireless communication system, including the wireless communication system 100. For example, the frame structure 300 may be used in LTE/LTE-A or similar systems. Each frame structure 300 may have a radio frame length 310 of 10 ms and may include 10 subframes 315 of 1 ms each. Each subframe 315 may be further divided into two slots or half-subframes of length 0.5 ms, where each slot may contain six or seven symbols. An OFDMA component carrier 320 may be illustrated as a resource grid representing two time slots. The resource grid may be divided into multiple resource elements 325. Each resource element may carry a modulated symbol In LTE/LTE-a, a resource block 330 may contain 12 consecutive subcarriers in the frequency domain and, for a normal cyclic prefix in each OFDM symbol, 7 consecutive OFDM symbols in the time domain, or 84 resource elements. Some of the resource elements, designated R (e.g., 335), may include DL reference signals (DL-RS). The DL-RS may include Cell-specific RS (CRS) (also sometimes called common RS) and UE-specific RS (UE-RS). UE-RS may be transmitted only on the resource blocks upon which the corresponding physical DL shared channel (PDSCH) 340 is mapped (not shown). The number of bits carried by each resource element may depend on the modulation scheme. Thus, the more resource blocks that a UE receives and the higher the modulation scheme, the higher the data rate may be for the UE.

As illustrated in FIG. 3, PDCCH 345 is generally time-division multiplexed with PDSCH 340 and generally is fully distributed within the entire bandwidth of the component carrier 320 within a first region of each subframe 315. In the example illustrated in FIG. 3, PDCCH 345 takes up the first three symbols of the subframe 315. PDCCH 345 may have more or fewer symbols as is appropriate based on the component carrier bandwidth and amount of control information for the subframe 315. The PHICH and/or PCFICH channels may be found in the first symbol of PDCCH 345 (not shown).

The PDCCH carries downlink control information (DCI) in control channel elements (CCEs). The DCI includes information regarding the downlink scheduling assignments, uplink resource grants, transmission scheme, uplink power control, hybrid automatic return repeat request (HARQ) information, modulation and coding schemes (MCS) and other information. A DCI can be UE-specific (dedicated) or cell-specific (common) and placed in different dedicated and common search spaces within the PDCCH depending on the format of the DCI. A UE attempts to decode the DCI by performing a process known as a blind decode, during which a plurality of decode attempts are carried out in the search spaces until the DCI is detected.

The size of the DCI messages can differ depending on the type and amount of information that is carried by the DCI. For example, if spatial multiplexing is supported, the size of the DCI message is larger compared to scenarios where contiguous frequency allocations are made. Similarly, for a system that employs MIMO, the DCI must include additional signaling information that is not needed for systems that do not utilize MIMO. Accordingly, the DCI has been categorized in different formats that are suited for different configurations. The size of a DCI format depends not only on the amount of information that is carried within the DCI message, but also on other factors such as the transmission bandwidth, the number of antenna ports, TDD or FDD operating mode, etc.

It should be noted that in some systems, the DCI messages are also appended with cyclic redundancy check (CRC) bits to for error detection. The coded DCI bits are then mapped to control channel elements (CCEs) according to the DCI format. A PDCCH can carry DCI messages associated with multiple user equipments. A particular user equipment must, therefore, be able to recognize the DCI messages that are intended for that particular user equipment. To that end, a user equipment is assigned certain identifiers (e.g., a cell radio network temporary identifier—C-RNTI) that facilitate the detection of the DCI associated with that user equipment. To reduce signaling overhead, the CRC bits that are attached to each DCI payload are scrambled (e.g., masked) with the identifier (e.g., C-RNTI) associated with a particular user equipment and/or an identifier that is associated with a group of user equipments. In an operation known as a "blind decode," the user equipment can descramble (or de-mask) all potential DCI messages using its unique identifier, and perform a CRC check on the DCI payload. If the CRC check passes, the content of the control channel is declared valid for the user equipment, which can then process the DCI.

To reduce power consumption and overhead at the user equipment, a limited set of control channel element (CCE) locations can be specified, wherein the set of CCE locations include locations at which a DCI payload associated with a particular UE can be placed. For example, a CCE may consist of nine logically contiguous resource element groups (REGs), where each REG contains 4 resource elements (REs). Each RE is one frequency-time unit. CCEs can be aggregated at different levels (e.g., 1, 2, 4 and 8) depending on the DCI format and the system bandwidth. The set of CCE locations in which the user equipment can find its corresponding DCI messages are considered a search space. The search space can be partitioned into two regions: a common CCE region or search space and a UE-specific (dedicated) CCE region or search space. The common CCE region is monitored by all UEs served by an eNodeB and can include information such as paging information, system information, random access procedures and the like. The UE-specific CCE region includes user-specific control information and is configured individually for each user equipment. CCEs are numbered consecutively and common search spaces and UE-specific search spaces may span overlapping CCEs. The common search space always starts from CCE 0, while UE specific search spaces have starting CCE indices that depend on the UE ID (e.g., C-RNTI), the subframe index, the CCE aggregation level and other random seeds.

When transmission diversity is used to transmit data, multiple versions of the same data may be transmitted over multiple channels. Each of the channels may be defined according to one or more partitions in a time domain (e.g., time slots), frequency domain (e.g., subcarriers), coding domain (e.g., CDMA coding), or antenna/direction (e.g., different antenna ports). Thus, using the example frame structure 300 of FIG. 3, transmission diversity may be achieved by transmitting the different versions of the data using different resource elements. However, transmission diversity may also be achieved by transmitting the different versions of the data using the same resource elements and different coding, antennas, or direction. Thus, a UE or base station that receives an interference signal corresponding to certain resource elements in a frame may monitor other resource elements for different versions of the same interference signal. The UE or base station may further monitor the same or different resource elements with respect to other coded or directional channels for different versions of the interference signal. Thus, an interfering transmission may include one or more interfering transmissions from a neighboring cell and/or interfering transmissions from a serving cell. If the UE or base station determines that transmission diversity is used with respect to the interference signal, the UE or base station may combine two or more of the received versions of the interference signal to estimate and cancel the interference signal.

Figure 4:
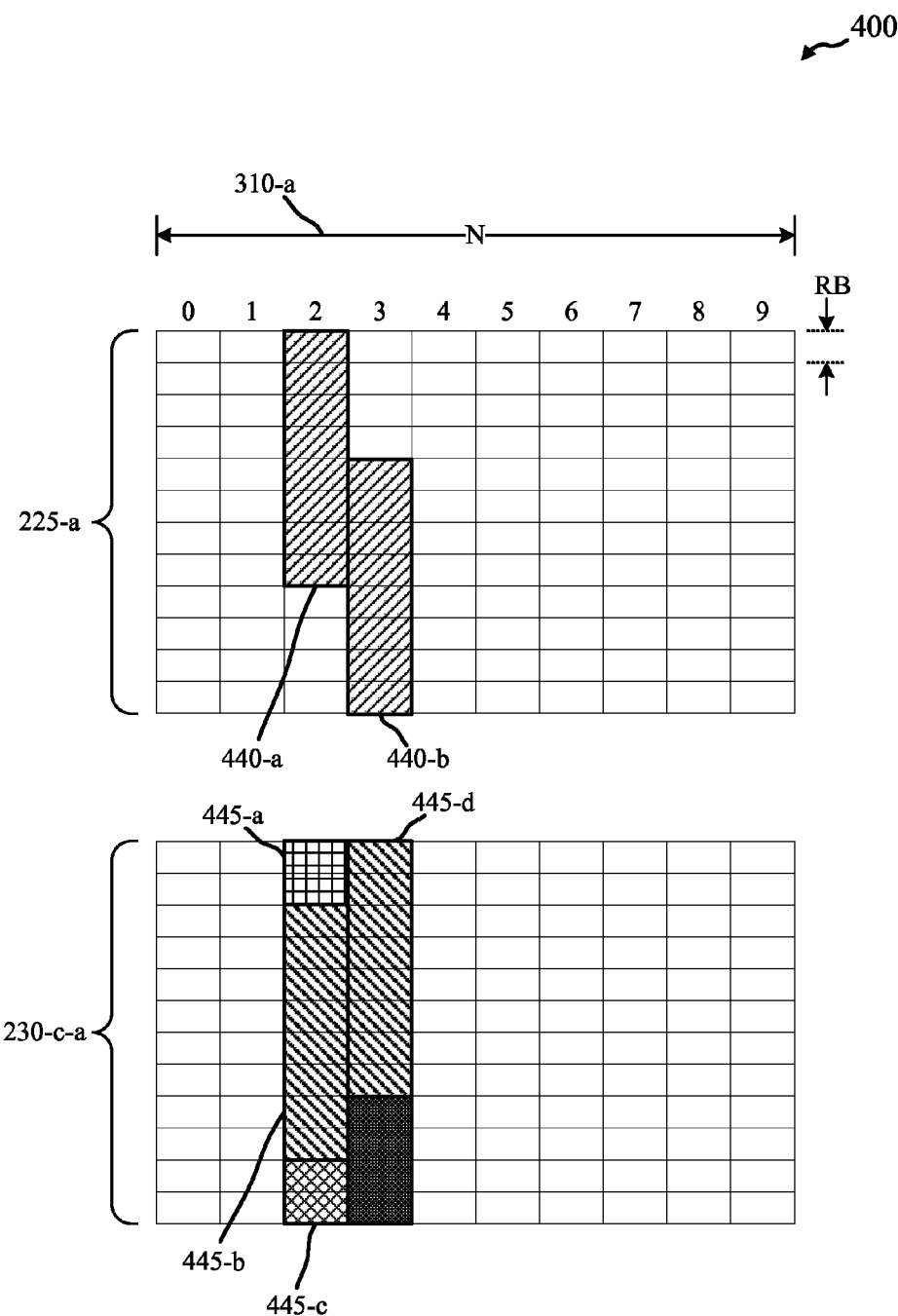
FIG. 4 is a timing diagram that illustrates example timing for transmissions in the environment of FIG. 2.

FIG. 4 is a timing diagram 400 that illustrates example timing for transmissions in the environment of FIG. 2. In timing diagram 400, serving cell transmission 225-a from eNB 105-a includes PDSCH resource grants 440-a and 440-b for UE 115-a. PDSCH resource grant 440-a includes 8 RBs during subframe 2 of frame 310-a and PDSCH resource grant 440-b includes 8 RBs during subframe 3 of frame 310-a. Transmission 230-c-a from eNB 105-c includes PDSCH resource grants 445-a, 445-b, 445-c, and 445-d intended for other UEs (e.g., UE 115-d, etc.). Thus, UE 115-a may receive a signal that includes the desired payloads 440-a and 440-b of transmission 225-a overlapped with the interfering payloads 445-a, 445-b, 445-c, and 445-d of transmission 230-c-a. UE 115-a may employ one or more advanced interference management techniques for cancelling transmission 230-c-a to enable successful decoding of the desired payloads 440-a and 440-b of transmission 225-a. As illustrated in timing diagram 400, UE 115-a may receive a payload (440-a or 440-b) from the serving cell in each subframe. Thus, IC for the interfering payloads 445-a, 445-b, 445-c, and 445-d and decoding of the serving cell payloads 440-a and 440-b should take less than the subframe time (e.g., 1 ms, etc.) to prevent buildup of symbols in the queue of received signal information.

Figure 5:
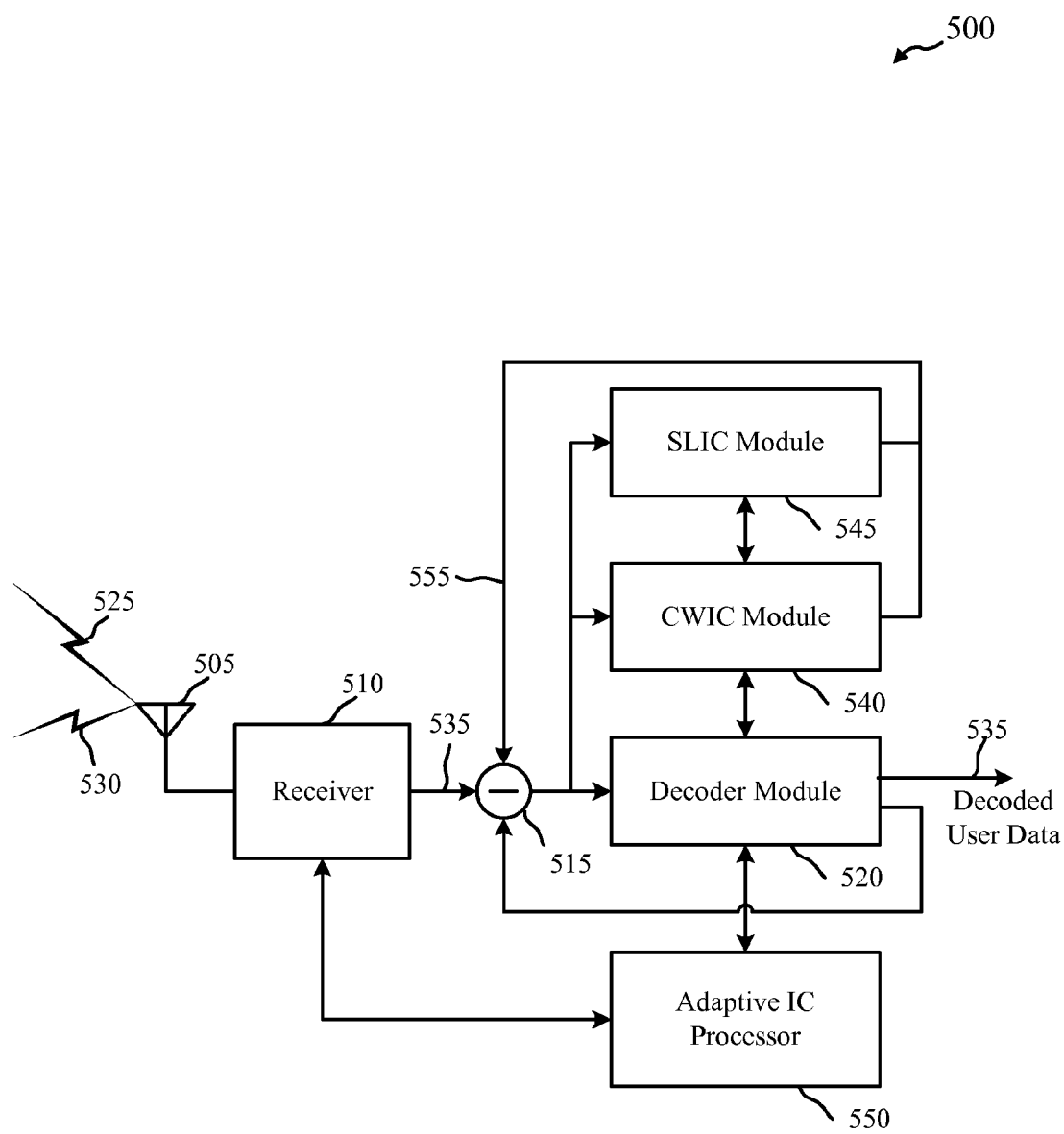
FIG. 5 is a block diagram of an example system for adaptive interference cancellation in accordance with various embodiments.

FIG. 5 is a block diagram of an example system 500 for adaptive interference cancellation in accordance with various embodiments. System 500 may be implemented in UEs 115 and eNBs 105 of FIG. 1 and/or FIG. 2. System 500 includes antenna(s) 505, receiver 510, summation node 515, decoder module 520, CWIC module 540, SLIC module 545, and adaptive IC processor 550. Antenna(s) 505 may receive a radio frequency signal including one or more serving cell transmissions 525 overlapped with one or more interfering transmissions 530. Receiver 510 may receive and process the signal (e.g., downconverting to baseband, analog-to-digital (ADC) conversion, cyclic prefix removal, serial to parallel conversion, fast fourier transform (FFT), etc.) to generate a received signal 535 including a set of symbols corresponding to the received transmissions.

Decoder module 520 may include elements and circuits for decoding the serving cell transmission 525. For example, decoder module 520 may include an iterative decoder such as a turbo decoder. Decoder module 520 may also include encoding circuits for reconstructing the transmitted symbols corresponding to the decoded serving cell transmission. CWIC module 540 may include elements and circuits for decoding interfering transmissions. CWIC module 540 may include an iterative decoder for decoding received symbols of the interfering transmissions into codewords of the interfering payloads. CWIC module 540 may also include an encoder for reconstructing the interfering symbols from the codewords for interference cancellation. In one embodiment, CWIC module 540 includes a turbo decoder for performing iterative decoding and a turbo encoder for reconstructing transmitted symbols of interfering transmissions from decoded codewords. In some embodiments, decoder module 520 and CWIC module 540 may be implemented in a single module that performs decoding and reconstruction of the serving cell payloads and interfering payloads. SLIC module 545 may include elements and circuits for estimating interfering bits corresponding to each symbol and reconstructing an estimate of the interfering signal using the bit estimates.

Adaptive IC processor 550 may configure decoder module 520, CWIC module 540, and SLIC module 545 for performing adaptive interference cancellation using the techniques described below. Adaptive IC processor 550 may use various techniques for employing SLIC and/or CWIC to generate an estimated interfering signal 555 of interfering transmissions 530 which are subtracted from the received symbols at summation node 515 to separate the interfering transmissions 530 from the desired transmissions 525. Decoder module 520 may then process the desired transmissions 525 to produce the decoded user data 535. The received signal 535 may include symbols received on multiple transmission resources (e.g., subcarriers, resource blocks, etc.) and summation node 515 may operate on individual transmission resources. For example, CWIC module 540 may perform CWIC for an interfering transmission 530 which may overlap with a portion of the received signal 535. The estimated interfering signal 555 reconstructed by CWIC module 540 may be subtracted for the overlapping portion of the payloads at summation node 515. System 500 may be employed as part of the HARQ techniques described above for error control of the desired transmissions 525.

Figure 6:
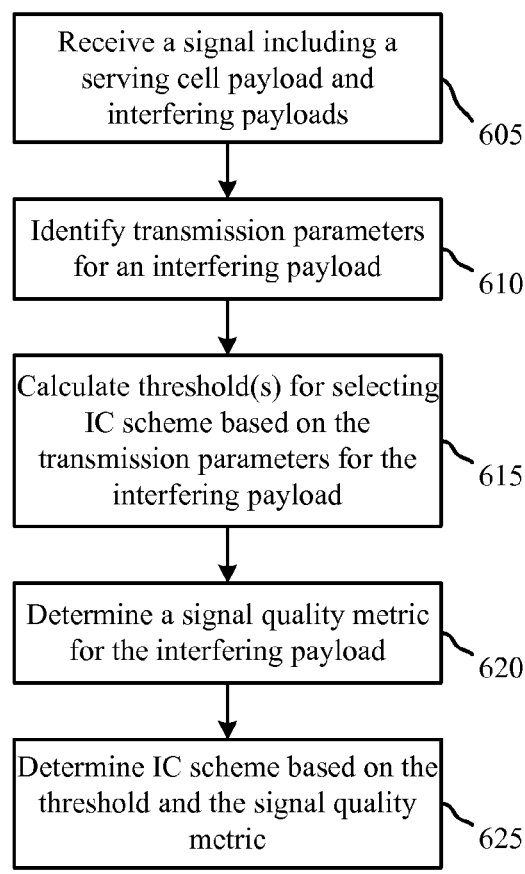
FIG. 6 illustrates a method for real-time determination of an interference cancellation scheme for an interfering transmission in accordance with various embodiments.

FIG. 6 illustrates a method 600 for real-time determination of an IC scheme for an interfering transmission in accordance with various embodiments. For purposes of description, method 600 is described with reference to system 500 illustrated in FIG. 5, which may be implemented, for example, in eNBs 105 and UEs 115 illustrated in FIG. 1 and/or FIG. 2. For example, method 600 may be used on the downlink by adaptive IC processor 550 to determine, in real-time, whether to perform CWIC, SLIC, or no interference cancellation for a given interfering transmission. However, method 600 may be employed by other systems and/or devices using architectures such as those illustrated in FIG. 14.

Method 600 may begin at block 605 where a signal (e.g., signal 535) is received that includes a serving cell transmission and interfering transmissions. At block 610, the adaptive IC processor 550 may determine transmission parameters for an interfering payload of the received signal 535. The transmission parameters may be identified by, for example, by receiving the transmission parameters from the network, blind decoding the transmission parameters, and/or decoding of DCI information associated with the interfering payload. The identified transmission parameters for the interfering payload may include the code rate, the modulation scheme, the spatial scheme, the rank, the transport block size, the allocated PRBs, and/or the redundancy version.

At block 615, the adaptive IC processor 550 may calculate one or more thresholds for IC scheme selection based on the transmission parameters for the interfering payload. The thresholds may be, for example, received signal quality thresholds (e.g., SINR, etc.) for successful symbol detection or decoding of the interfering signal. For example, adaptive IC processor 550 may use predetermined relationships between modulation scheme, code rate, spatial scheme, and/or rank of a received signal and received signal SINR for successful decoding of the interfering payload.

At block 620, the adaptive IC processor 550 may determine a signal quality metric (e.g., SINR, etc.) for the interfering transmission. The adaptive IC processor 550 may determine the signal quality metric by, for example, measuring reference signals associated with the interfering transmission and may account for fading and/or transmission power ratio (TPR) of the interfering transmission.

At block 625, the adaptive IC processor 550 may determine an IC scheme based on the signal quality threshold and the signal quality metric for the interfering transmission. For example, where the signal quality metric exceeds a threshold for successful decoding of the interfering transmission, CWIC may be performed on the interfering transmission to produce an estimated interfering signal 555, which may be subtracted from the received signal 535. Where the signal quality metric does not exceed a threshold for successful decoding of the interfering transmission, SLIC may be performed instead. In yet other instances, adaptive IC processor may determine, based on the signal quality metric of the interfering transmission and the threshold, that insufficient signal quality is present in the interfering transmission for running SLIC and no IC may be performed on the interfering transmission.

In some examples, the adaptive IC processor 550 may determine the IC scheme based on whether the interfering transmission is an initial transmission of a transport block or a retransmission of the transport block. Retransmissions may be primarily parity information and may be difficult to decode without having received the systematic information. Thus, where the interfering payload is determined to be a retransmission, the adaptive IC processor 550 may perform SLIC instead of CWIC even where the SINR for the interfering payload exceeds a threshold for successful decoding of an initial transmission.

Figure 7:
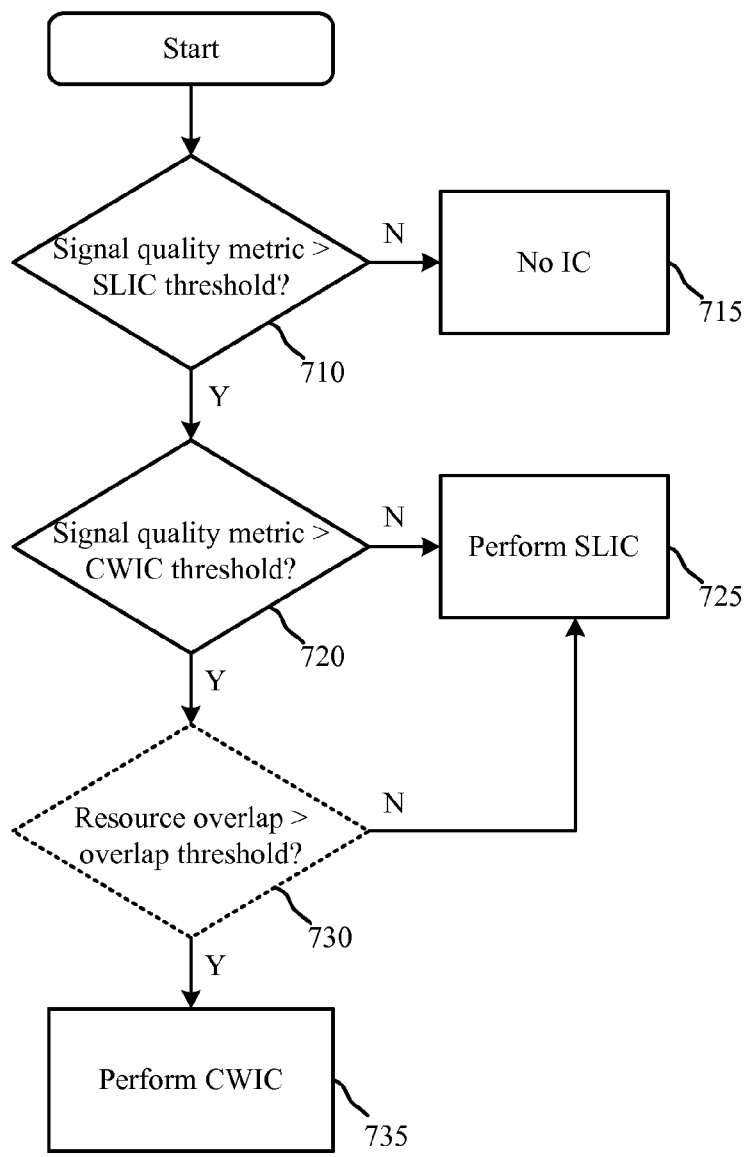
FIG. 7 illustrates a method for determination of interference cancellation scheme based on signal quality thresholds in accordance with various embodiments.

FIG. 7 illustrates a method 700 for determination of IC scheme based on signal quality thresholds in accordance with various embodiments. Method 700 may be performed, for example, at block 625 of method 600 to determine an IC scheme based on the signal quality threshold and the signal quality metric for an interfering transmission. For purposes of description, method 700 is described with reference to system 500 illustrated in FIG. 5, which may be implemented, for example, in eNBs 105 and UEs 115 illustrated in FIG. 1 and/or FIG. 2. However, method 700 may be employed by other systems and/or devices using architectures such as those illustrated in FIG. 14.

Method 700 may begin at block 710 where a signal quality metric for an interfering signal may be compared with a signal quality threshold for performing SLIC. Where the signal quality metric is less than the signal quality threshold for performing SLIC, the adaptive IC processor 550 may determine at block 715 that no IC should be performed for the interfering transmission.

If the signal quality metric is greater than the signal quality threshold for performing SLIC at block 710, the signal quality metric may be compared to a signal quality threshold for performing CWIC at block 720. Where the signal quality metric is less than the signal quality threshold for performing CWIC, the adaptive IC processor 550 may perform SLIC at block 725. Where the signal quality metric exceeds the signal quality threshold for performing CWIC at block 720, the adaptive IC processor 550 may perform CWIC on the interfering transmission at block 735.

Optionally, method 700 may include block 730 where the amount of resource overlap of the interfering transmission with the serving cell payload is compared with an overlap threshold. Where the amount of resource overlap does not warrant the additional complexity of running CWIC, method 700 reverts back to performing SLIC at block 725.

Where CWIC is performed based on the comparison with the CWIC threshold, convergence monitoring of iterative decoding of the interfering payload may be performed to determine if the decoding process will converge. In some instances, the decoding process may fail to converge because of insufficient signal quality in the received interfering signal. In other instances, the decoding process may fail to converge because identified transmission parameters for an interfering payload may be incorrect. For example, where the UE decodes DCI intended for another user, the UE may interpret the DCI grant incorrectly. Thus, the identified transmission parameters may not correspond to the interfering payload. Where the decoding process will not converge, CWIC may be stopped and another IC scheme may be run instead (e.g., SLIC) for the interfering transmission.

Figure 8:
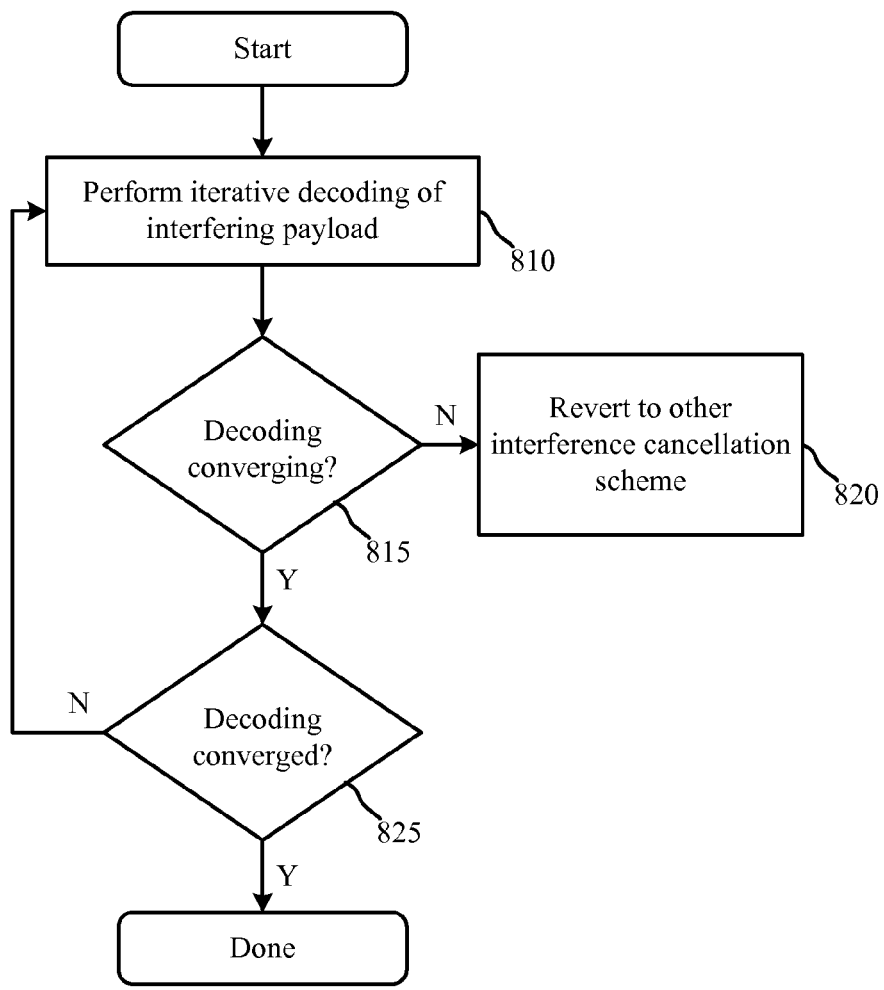
FIG. 8 illustrates a method for performing codeword level interference cancellation with convergence monitoring for an interfering transmission in accordance with various embodiments.

FIG. 8 illustrates a method 800 for performing CWIC with convergence monitoring for an interfering transmission in accordance with various embodiments. For purposes of description, method 800 is described with reference to system 500 illustrated in FIG. 5, which may be implemented, for example, in eNBs 105 and UEs 115 illustrated in FIG. 1 and/or FIG. 2. However, method 800 may be employed by other systems and/or devices using architectures such as those illustrated in FIG. 14.

Method 800 may begin at block 810 where iterative decoding is performed. At predetermined intervals (e.g., after each iteration, etc.), a convergence metric is monitored at block 815 to determine if it is likely that the iterative decoding will converge for the interfering transmission. Determining whether the iterative decoding will converge at block 815 may be based on a number of elapsed iterations and the soft decision output of the iterative decoder. For example, extrinsic information based on log likelihood ratios (LLRs) of the decoded bits may be monitored and if the extrinsic information does not indicate within a certain number of iterations that the decoder is moving towards convergence, the decoder is not likely to converge. Block 815 may monitor the convergence metric based on a predetermined relationship of the number of iterations and values of the convergence metric indicating that iterative decoding is not likely to converge.

If the iterative decoding is not likely to converge, adaptive IC processor 550 reverts to another interference cancellation scheme (e.g., SLIC, etc.) at block 820. Method 800 may continue to run until the iterative decoder converges at block 825 or indicates that it will not converge at block 815.

Figure 9:
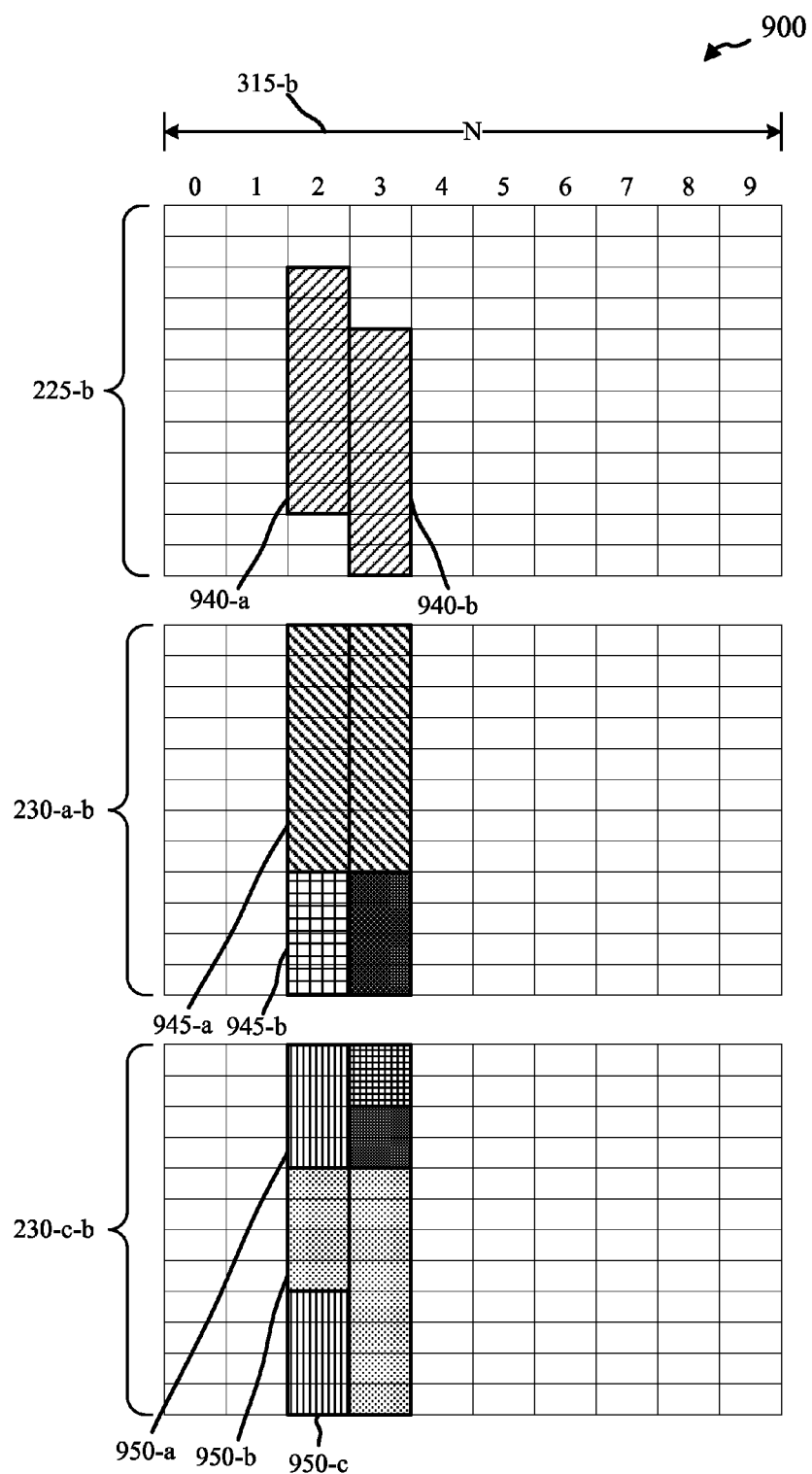
FIG. 9 is a timing diagram that illustrates example timing for transmissions in the environment of FIG. 2.

In some instances, multiple interfering transmissions may be received that have varying levels of resource overlap with the serving cell transmission. FIG. 9 is a timing diagram 900 that illustrates example timing for transmissions in the environment of FIG. 2. In timing diagram 900, serving cell transmission 225-*b* from eNB 105-*b* includes PDSCH resource grants 940-*a* and 940-*b* for UE 115-*b*. PDSCH resource grant 940-*a* includes 8 RBs during subframe 2 of frame 310-*b* and PDSCH resource grant 940-*b* includes 8 RBs during subframe 3 of frame 310-*b*. Transmission 230-*a*-*b* from eNB 105-*a* includes PDSCH resource grants 945-*a* and 945-*b* intended for other UEs (e.g., UE 115-*a*, etc.). Transmission 230-*c*-*b* from eNB 105-*c* includes PDSCH resource grants 950-*a*, 950-*b*, and 950-*c* intended for other UEs (e.g., UE 115-*d*, etc.). Thus, UE 115-*b* may receive a signal that includes the desired payloads 940-*a* and 940-*b* of transmission 225-*b* overlapped with the interfering payloads 945-*a*, 945-*b*, 950-*a*, 950-*b*, and 950-*c* of transmissions 230-*a*-*b* and 230-*c*-*b*.

Depending on the available processing resources and time for decoding a received signal, UE 115-*b* may perform CWIC for one of the interfering payloads or up to all interfering payloads. In some embodiments, UE 115-*b* determines an order for performing CWIC on the interfering payloads based on the amount of overlap, the overlapping signal energy, and/or the probability of successfully decoding the interfering payloads. As illustrated in FIG. 9, for example, interfering payload 945-*a* may overlap the desired payload 940-*a* by 6 RBs, while interfering payloads 945-*b*, 950-*a*, 950-*b*, and 950-*c* may overlap the desired payload 940-*a* by 2 RBs, 2 RBs, 4 RBs, and 2 RBs, respectively. Thus, UE 115-*b* may perform CWIC on interfering payload 945-*a* first, and may perform CWIC on additional interfering payloads based on available time for completing interference cancellation and decoding of the desired payload.

In some embodiments, UE 115-*b* may perform CWIC first on payloads having a highest overlapping signal energy with the desired payload 940-*a*. For example, transmission 230-*c*-*b* may be received with higher signal energy (e.g., higher SINR, etc.) than transmission 230-*a*-*b*. As a result, interfering payload 950-*b* may have a higher overlapping signal energy than interfering payload 945-*a* even though it overlaps fewer resources. Overlapping energy for each interfering payload 945-*a*, 945-*b*, 950-*a*, 950-*b*, and 950-*c* may be determined by taking into account TPR and/or fading amplitude on each RB of the interfering payloads.

In some embodiments, UE 115-*b* takes the probability of successful decoding into account in determining the order for performing CWIC on interfering payloads. For example, a payload overlapping a smaller number of resources may have a higher probability of decoding and may, therefore, provide a higher likelihood that CWIC will produce beneficial results. The probability of successful decoding may be determined based on the code rate, modulation scheme, spatial scheme and rank, and signal quality of the interfering transmission. In some embodiments, the likelihood that the identified grant for the interfering payload is incorrect may also be taken into account. For example, interfering payloads for which transmission parameters are received through network signaling may be given priority for performing CWIC over interfering payloads for which DCI decoding is performed.

Figure 10:
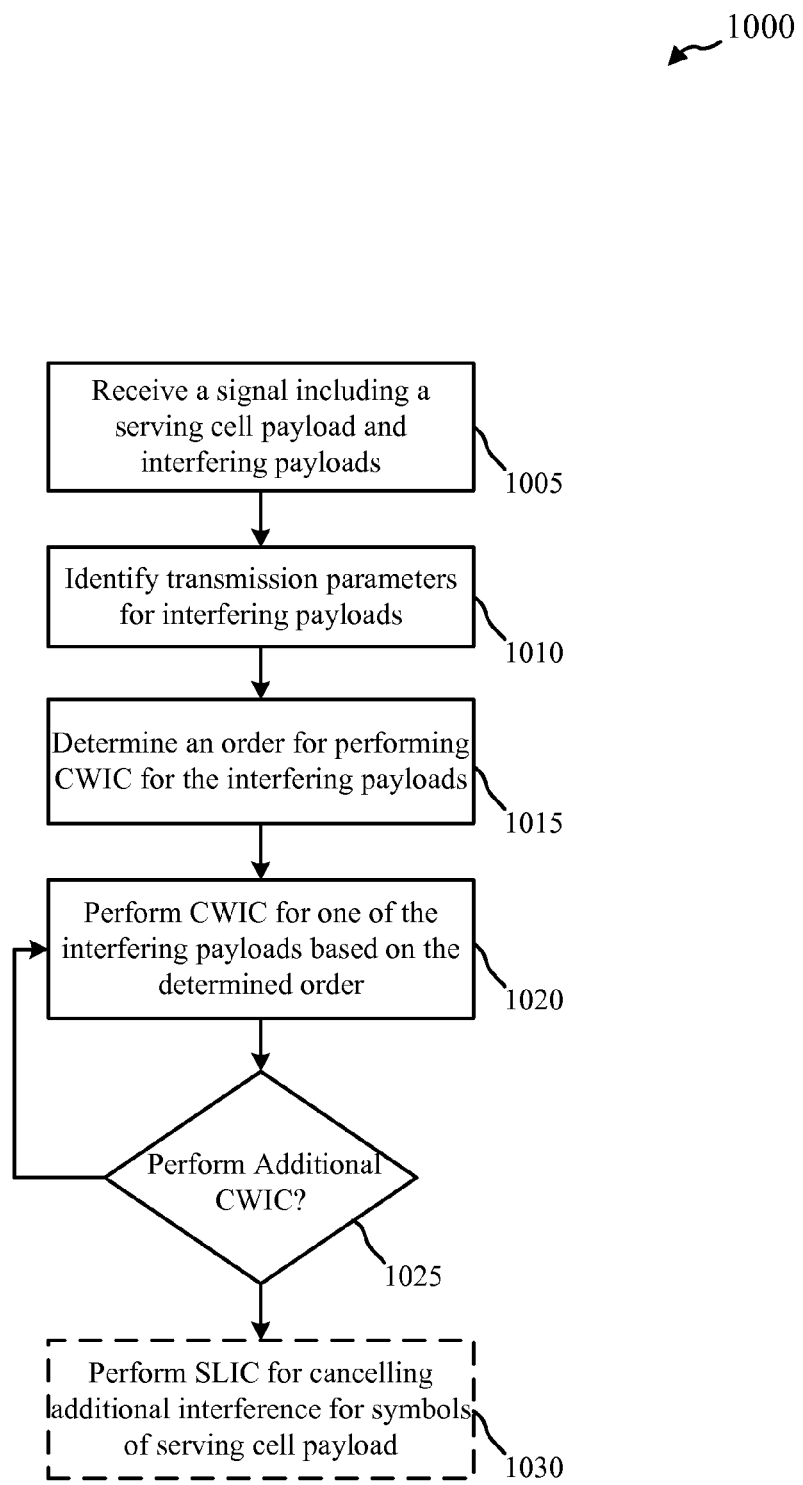
FIG. 10 illustrates a method for real-time determination of interference cancellation schemes for multiple interfering transmissions in accordance with various embodiments.

FIG. 10 illustrates a method 1000 for real-time determination of IC schemes for multiple interfering transmissions in accordance with various embodiments. For purposes of description, method 1000 is described with reference to system 500 illustrated in FIG. 5, which may be implemented, for example, in eNBs 105 and UEs 115 illustrated in FIG. 1 and/or FIG. 2. For example, method 1000 may be used on the downlink by adaptive IC processor 550 to determine, in real-time, IC schemes and order of cancellation for multiple interfering transmissions. However, method 1000 may be employed by other systems and/or devices using architectures such as those illustrated in FIG. 14.

Method 1000 may begin at block 1005 where a signal is received that includes a serving cell payload and interfering payloads. At block 1010, the adaptive IC processor 550 may determine transmission parameters for some or all of the interfering payloads of the received signal. The transmission parameters may be identified by, for example, receiving the transmission parameters from the network, blind decoding the transmission parameters, and/or decoding of DCI information associated with the interfering payload. The identified transmission parameters for the interfering payloads may include the code rate, the modulation scheme, the spatial scheme, the rank, the transport block size, the allocated PRBs, and/or the redundancy version.

At block 1015, the adaptive IC processor 550 may determine an order for performing CWIC on the interfering payloads. For example, the IC processor may determine the order for performing CWIC on the interfering payloads based on the amount of overlap, the overlapping signal energy, and/or the probability of successfully decoding the interfering payloads.

At block 1020, CWIC may be performed for the highest priority interfering payload based on the order determined at block 1015. Convergence monitoring may be used to determine if iterative decoding of the interfering payload is converging and CWIC may be aborted if it is determined that iterative decoding is not converging as discussed above with reference to FIG. 8.

At block 1025, the adaptive IC processor 550 may determine whether to perform CWIC on additional interfering payloads. Adaptive IC processor 550 may continue to perform CWIC for additional interfering payloads based on the amount of overlap, the overlapping signal energy, and/or the probability of successfully decoding the additional interfering payloads. For example, the adaptive IC processor 550 may perform CWIC on all interfering payloads that meet certain criteria for resource overlap, overlapping signal energy, or probability of successful decode.

Optionally, the adaptive IC processor 550 may perform SLIC at block 1030 for symbols of the serving cell payload after performing CWIC on some number of interfering payloads. For example, SLIC may be run on any symbols overlapping with interfering payloads for which CWIC was not performed.

When performing CWIC according to the various techniques for IC scheme selection and ordering described above, the number of iterations for iterative decoding of interfering transmissions may be dynamically selected to optimize IC performance. For example, a number of iterations for iterative decoding may be determined for a given interfering payload and the decoder may be stopped after the number of iterations. Even where the decoder has not fully converged, the decoder output (e.g., soft decision bits) may be used to perform interference cancellation of the interfering payload. While the non-converged decoder output does not correspond to the transmitted codeword without errors, it may, when reconstructed into the transmitted symbols and cancelled from the received signal, be beneficial to decoding the serving cell payload. In some embodiments, CWIC may be performed in multiple passes for the serving cell payload and each interfering payload for decoding a single subframe. When additional passes are performed for an interfering payload, the soft decision output from a prior pass may be used to initialize the iterative decoder for the subsequent passes.

Figure 11:
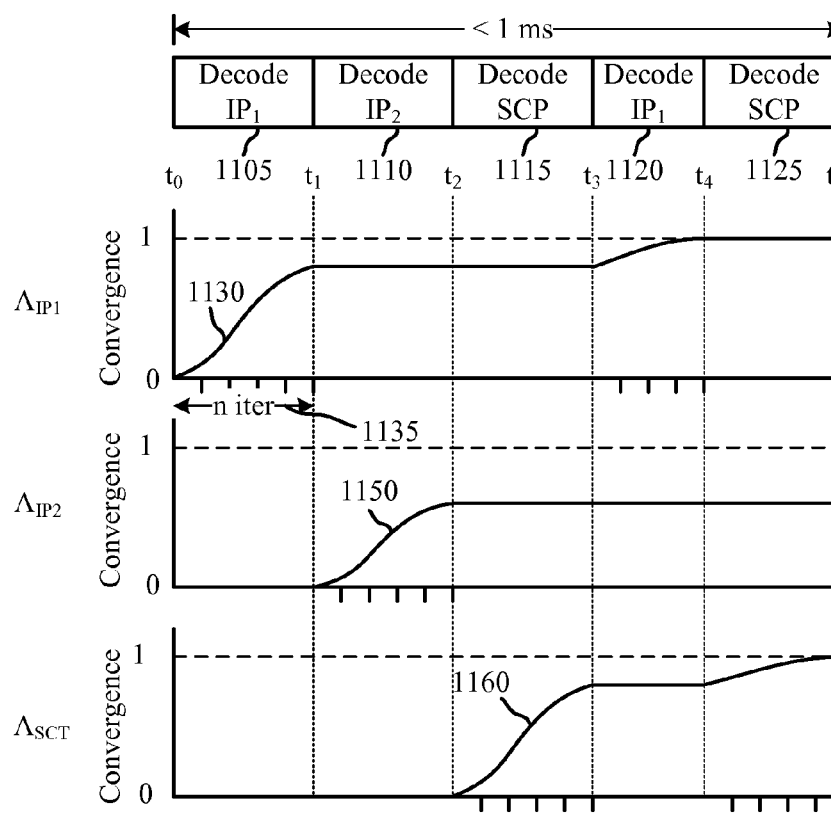
FIG. 11 is a timing diagram illustrating interference cancellation with dynamic selection of iterations for iterative decoding in accordance with various embodiments.

FIG. 11 is a timing diagram 1100 illustrating IC with dynamic selection of iterations for iterative decoding in accordance with various embodiments. Timing diagram 1100 illustrates that IC of interfering payloads and decoding of the serving cell payload may be performed in stages. As illustrated in FIG. 11, performing IC for interfering payloads and decoding the serving cell payload generally occurs in less than a subframe. Dynamic selection of iterative During a first stage 1105, CWIC may be performed on a first interfering payload $IP_1$. A number of iterations 1135 may be determined for performing CWIC in stage 1105. The number of iterations 1135 may be based on, for example, signal quality (e.g., SINR), code rate, and/or modulation scheme of the interfering payload. The number of iterations may also be determined based on the signal quality of the serving cell payload and/or the residual interference of the received signal.

After running the determined number of iterations, iterative decoding of the interfering payload $IP_1$ may not result in hard bits (converged decoder output) for the codeword of the interfering payload. For example, FIG. 11 illustrates that a convergence metric 1130 (e.g., extrinsic information based on LLRs, etc.) for the interfering payload may indicate that decoding of the interfering payload has not fully converged (where a convergence of 1 indicates that decoding has fully converged) after stage 1105. Even though not fully converged, the soft decision output for the decoder may be used to reconstruct an estimate of the transmitted symbols corresponding to the interfering payload and the reconstructed symbols may be cancelled from the received signal at time $t_1$. The soft decision output from the decoder may be stored.

At stage 1110, CWIC may be performed on a second interfering payload $IP_2$ based on a number of iterations determined for performing CWIC on interfering payload $IP_2$. After running the number of iterations, interfering payload $IP_2$ may not be fully decoded as illustrated by convergence metric 1150. IC may be performed at time $t_2$ based on the soft decision output and the soft decision output for interfering payload $IP_2$ may also be stored.

At stage 1115, CWIC may be performed for the serving cell payload for a certain number of iterations. After running the number of iterations, the serving cell payload may not be fully decoded as illustrated by convergence metric 1160. At time t3, the soft decision bits for the serving cell payload may be used to reconstruct an estimation of the transmitted symbols corresponding to the serving cell payload which may be subtracted from the received signal to perform cancellation of the serving cell payload. The soft decision bits for the serving cell payload after stage 1115 may be stored.

At stage 1120, a second CWIC pass may be performed for interfering payload $IP_1$. In embodiments, the iterative decoder is initialized with the stored soft decision output of the first CWIC pass at stage 1105. Thus, a number of iterations for decoding of interfering payload $IP_1$ during stage 1120 may be reduced as the stored soft decision outputs may represent partially converged LLRs for the iterative decoding. With the second interfering payload IP2 and the serving cell payload partially cancelled (cancelled based on non-converged decoding), the second CWIC pass may fully converge and hard bits for the codeword for interfering payload $IP_1$ may be generated at stage 1120. At time t4, the hard bits from successful decoding of interfering payload $IP_1$ may be used to perform IC for interfering payload $IP_1$.

With CWIC performed for interfering payload $IP_1$ using converged decoder output and CWIC performed for interfering payload $IP_2$ using partially converged decoder output, decoding of the serving cell payload may be performed at stage 1125. If decoding of the serving cell payload converges at stage 1125, the decoding process is complete and no further IC needs to be run. If decoding of the serving cell payload does not converge at stage 1125, further IC passes of interfering payload $IP_1$, interfering payload $IP_2$, and the serving cell payload may be performed.

Figure 12:
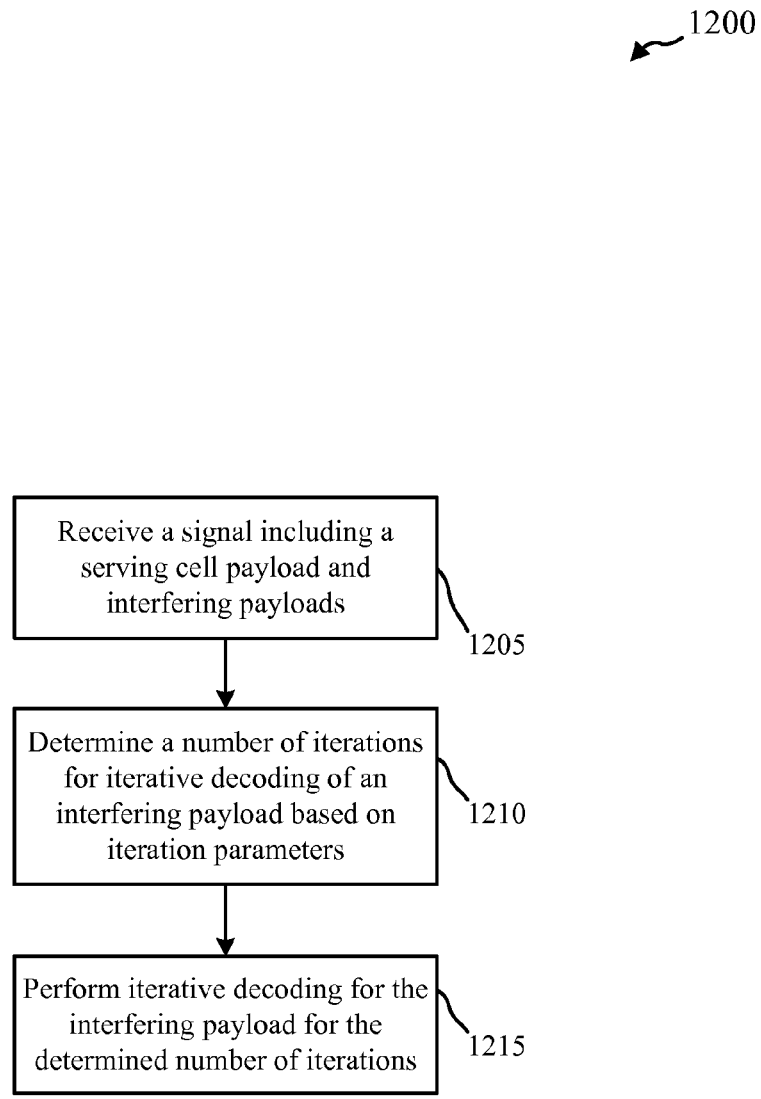
FIG. 12 illustrates a method for interference cancellation with dynamic selection of iterations for iterative decoding in accordance with various embodiments.

FIG. 12 illustrates a method 1200 for IC with dynamic selection of iterations for iterative decoding in accordance with various embodiments. For purposes of description, method 1200 is described with reference to system 500 illustrated in FIG. 5, which may be implemented, for example, in eNBs 105 and UEs 115 illustrated in FIG. 1 and/or FIG. 2. However, method 1200 may be employed by other systems and/or devices using architectures such as those illustrated in FIG. 15.

Method 1200 may begin at block 1205 where a signal (e.g., signal 535) is received that includes a serving cell payload and interfering payloads. At block 1210, a number of iterations for performing iterative decoding for IC may be determined based on iteration parameters. The iteration parameters may include, for example, signal quality (e.g., SINR), code rate and/or modulation scheme of the interfering payload, the signal quality of the serving cell payload, processing limitations, subframe and decode timing, bit-error rate of the decoded payload, and/or the residual interference of the received signal. In some examples, the number of iterations may be predetermined prior to running decoding based on the iteration parameters. In other examples, the iteration parameters may adaptively determine the number of iterations. For example, iterative decoding may be performed until a certain bit error rate (which may be approximated by monitoring the extrinsic information, etc.) is reached and the bit error rate may be determined based on one or more iteration parameters.

Processing limitations may account for the power consumption of performing iterative decoding and may be based on an amount of remaining battery life or other power metrics. Subframe and decode timing may take into account a number of iterations typically required for decoding the serving cell payload (e.g., based on the modulation and coding scheme, SINR, etc). For example, iterative decoding of an interfering transmission may be performed until a predetermined time period based on the number of interfering transmissions for performing CWIC or the amount of time for decoding the serving cell payload. The predetermined time period may account for an amount of data to be decoded or a received signal queue (e.g., whether more received signals are in a received signal queue, etc.).

At block 1215, iterative decoding may be performed on the interfering payload for the determined number of iterations. After running the determined number of iterations, iterative decoding of the interfering payload may not result in hard bits (converged decoder output) for the codeword of the interfering payload.

Figure 13:
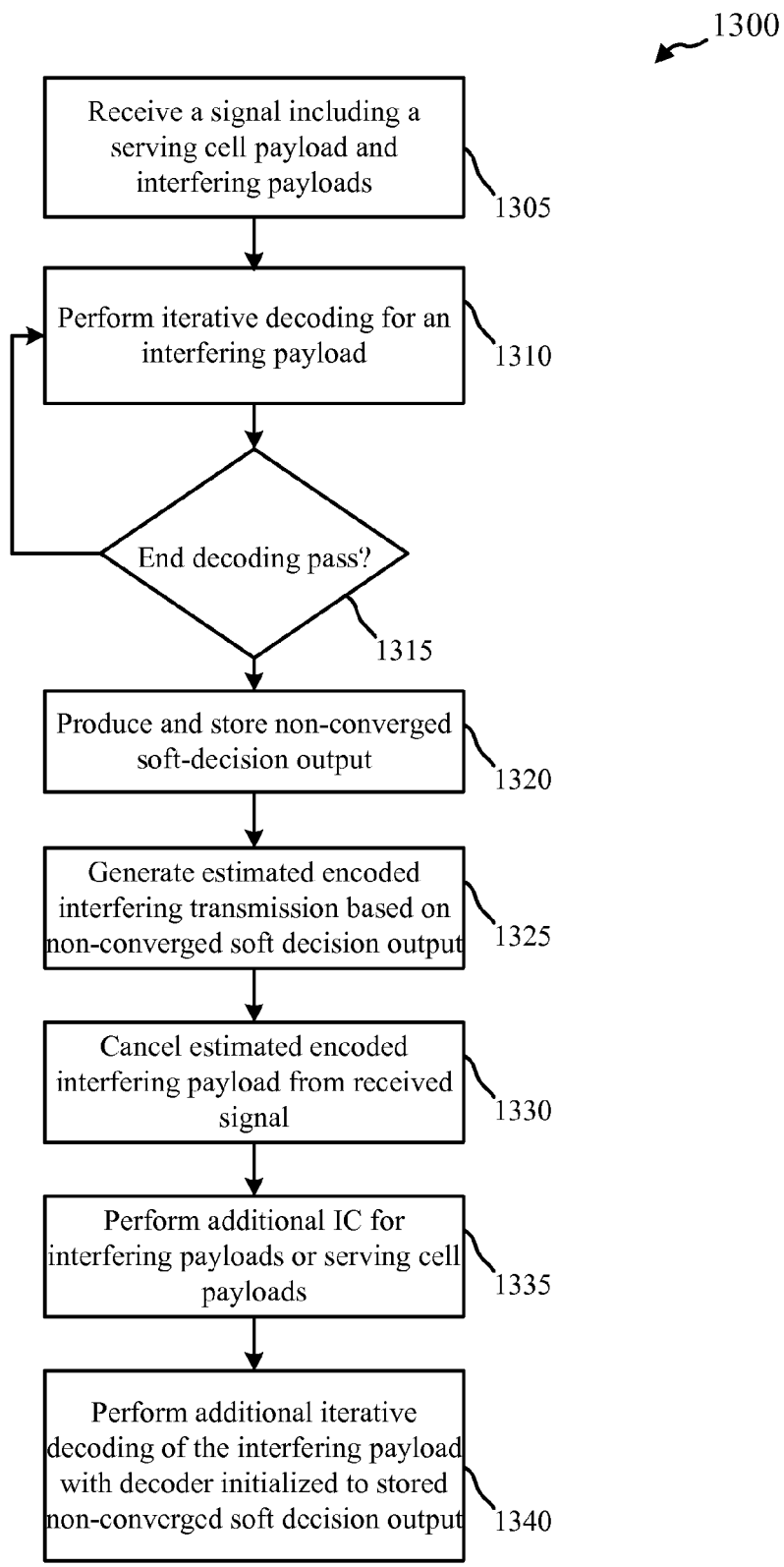
FIG. 13 illustrates a method for codeword level interference cancellation with dynamic selection of iterations for iterative decoding in accordance with various embodiments.

FIG. 13 illustrates a method 1300 for CWIC with dynamic selection of iterations for iterative decoding in accordance with various embodiments. For purposes of description, method 1300 is described with reference to system 500 illustrated in FIG. 5, which may be implemented, for example, in eNBs 105 and UEs 115 illustrated in FIG. 1 and/or FIG. 2. However, method 1300 may be employed by other systems and/or devices using architectures such as those illustrated in FIG. 16.

Method 1300 may begin at block 1305 where a signal (e.g., signal 535) is received that includes a serving cell payload and interfering payloads. At block 1310, iterative decoding may be performed for an interfering payload. At block 1315, the adaptive IC processor 550 may determine whether to finish the decoding pass for CWIC of the interfering payload. The decoding pass may be ended based on a predetermined level for a convergence metric (e.g., extrinsic information based on LLRs of the iterative decoding, etc.). For example, iterative decoding may be performed until the convergence metric indicates that the bit-error rate in the decoded codeword has reached a level that may be beneficial for CWIC. Additionally or alternatively, the decoding pass may be ended based on a predetermined number of iterations.

At block 1320, the non-converged soft decision output of the decoding pass may be produced by the iterative decoder and stored. At block 1325, an estimated encoded interfering transmission may be generated based on the non-converged interfering transmission soft-decision output. The estimated encoded interfering transmission may be canceled from the received signal at block 1330.

At block 1335, other IC operations may be performed for other interfering payloads or the serving cell payload. For example, CWIC may be performed for other interfering payloads or the serving cell payload. At block 1340, additional iterative decoding of the interfering payload may be performed with the decoder initialized based on the stored non-converged soft decision output.

Figure 14:
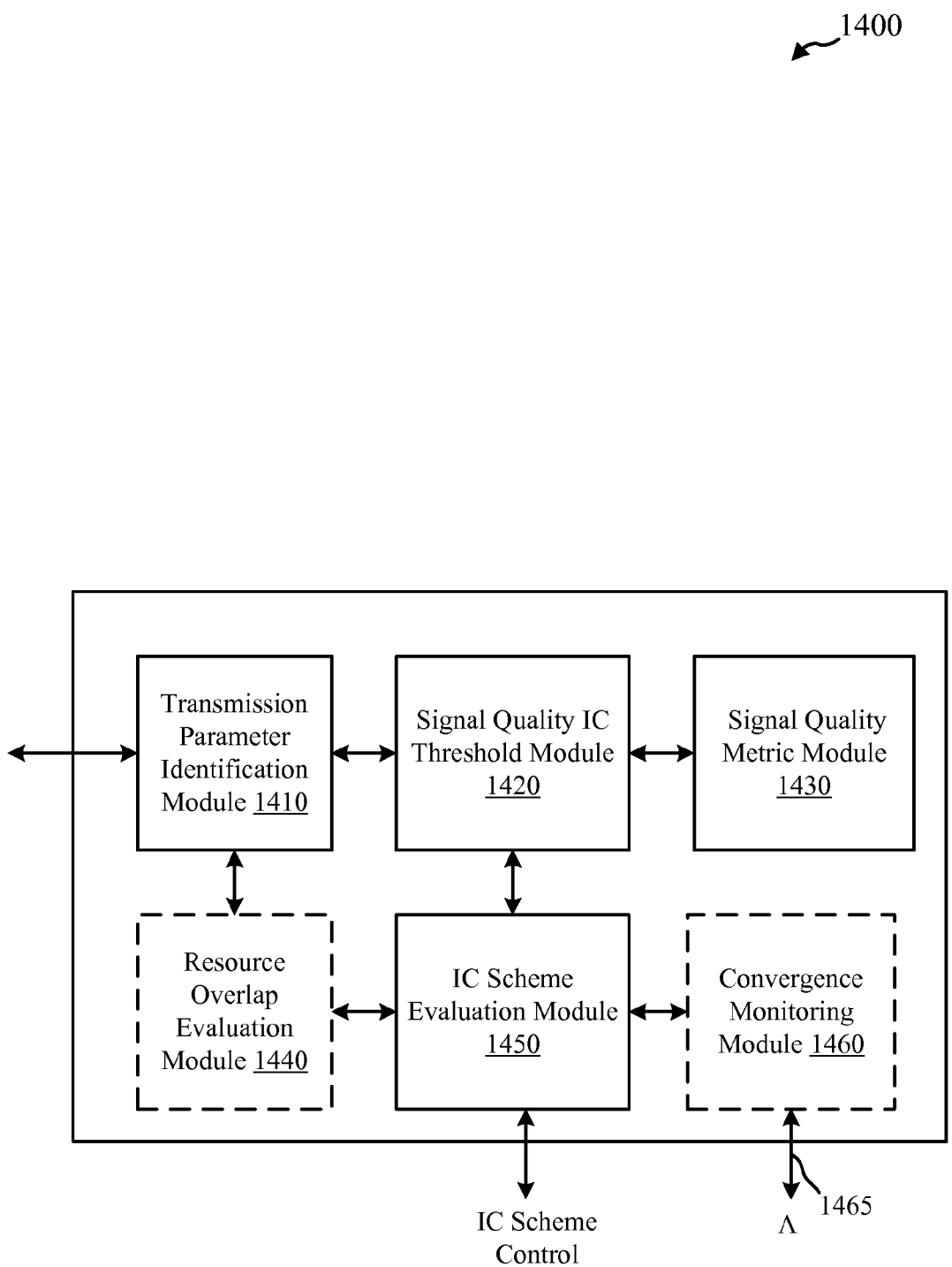
FIG. 14 illustrates a device for real-time determination of an interference cancellation scheme for an interfering transmission in accordance with various embodiments.

FIG. 14 illustrates a device 1400 for real-time determination of an IC scheme for an interfering transmission in accordance with various embodiments. Device 1400 may illustrate, for example, aspects of UEs 115 or eNBs 105 illustrated in FIG. 1 and/or FIG. 2. Device 1400 may be an example of adaptive IC processor 550. Device 1400 may include transmission parameter identification module 1410, signal quality IC threshold module 1420, signal quality metric module 1430, and IC scheme evaluation module 1450. Each of these components may be in communication with each other.

Transmission parameter identification module 1410 may identify transmission parameters for interfering payloads in a received signal. The transmission parameters may be identified by, for example, by receiving the transmission parameters from the network, blind decoding the transmission parameters, and/or decoding of DCI information associated with the interfering transmission. The identified transmission parameters for the interfering transmission may include the code rate, the modulation scheme, the spatial scheme, the rank, the transport block size, the allocated PRBs, and/or the redundancy version.

Signal quality IC threshold module 1420 may determine one or more thresholds for IC scheme selection based on the transmission parameters for the interfering payloads. The thresholds may be, for example, received signal quality thresholds (e.g., SINR, etc.) for successful symbol detection or decoding of the interfering payloads.

Signal quality metric module 1430 may determine a signal quality metric (e.g., SINR, etc.) for the interfering payload. Signal quality metric module 1430 may determine the signal quality metric by, for example, measuring reference signals associated with the interfering transmission and may account for fading and/or transmission power ratio (TPR) of the interfering payload.

IC scheme evaluation module 1450 may determine an IC scheme based on the signal quality threshold and the signal quality metric for the interfering transmission. For example, where the signal quality metric exceeds a threshold for successful decoding of the interfering transmission, CWIC may be performed on the interfering payload to produce a reconstructed estimate of the interfering symbols, which may be subtracted from the received signal. Otherwise, SLIC or some other IC scheme may be performed.

In some embodiments, device 1400 includes resource overlap evaluation module 1440, which may compare the amount of resource overlap of the interfering payload with the serving cell payload. Where the amount of resource overlap does not warrant the additional complexity of running CWIC, resource overlap evaluation module 1440 may indicate that SLIC or some other IC scheme should be performed instead.

In some embodiments, device 1400 includes convergence monitoring module 1460. When running CWIC, convergence monitoring module 1460 monitors convergence metric 1465 to determine if it is likely that the iterative decoding will converge for the interfering transmission. Determining whether the iterative decoding will converge may be based on a number of elapsed iterations and the soft decision output of the iterative decoder. For example, the convergence metric 1465 may be based on log likelihood ratios (LLRs) of the decoded bits. If the convergence metric does not indicate within a certain number of iterations that the decoder is moving towards convergence, the decoder is not likely to converge.

Figure 15:
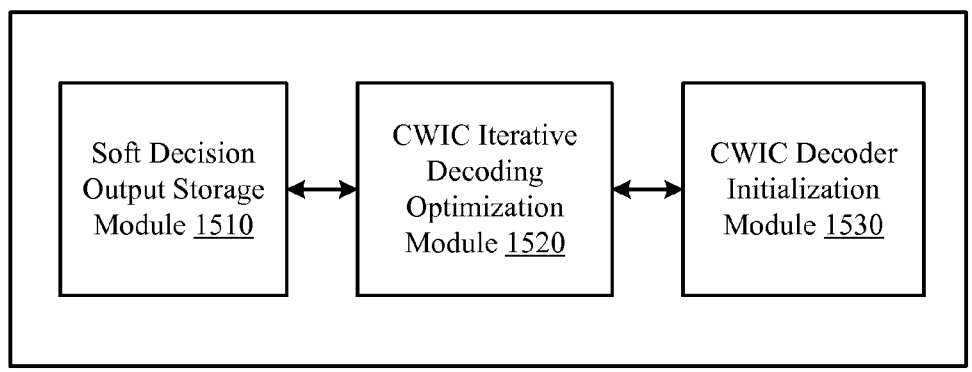
FIG. 15 illustrates a device for codeword level interference cancellation with dynamic selection of iterations for iterative decoding in accordance with various embodiments.

FIG. 15 illustrates a device 1500 for CWIC with dynamic selection of iterations for iterative decoding in accordance with various embodiments. Device 1500 may illustrate, for example, aspects of UEs 115 or eNBs 105 illustrated in FIG. 1 and/or FIG. 2. Device 1500 may be an example of adaptive IC processor 550. Device 1500 may include soft decision output storage module 1510, CWIC iterative decoding optimization module 1520, and CWIC decoder initialization module 1530. Each of these components may be in communication with each other.

CWIC iterative decoding optimization module 1520 may determine a number of iterations for performing iterative decoding for CWIC for an interfering payload based on iteration parameters. The iteration parameters may include, for example, signal quality (e.g., SINR), code rate, and/or modulation scheme of the interfering payload, the signal quality of the serving cell payload and/or the residual interference of the received signal. CWIC may be performed for the determined number of iterations for a decoding pass and non-converged soft decision output of the iterative decoder may be stored by soft decision output storage module 1510. For subsequent CWIC operations for the interfering payload, CWIC decoder initialization module 1530 may initialize the iterative decoding using the stored non-converged soft decision output.

Figure 16:
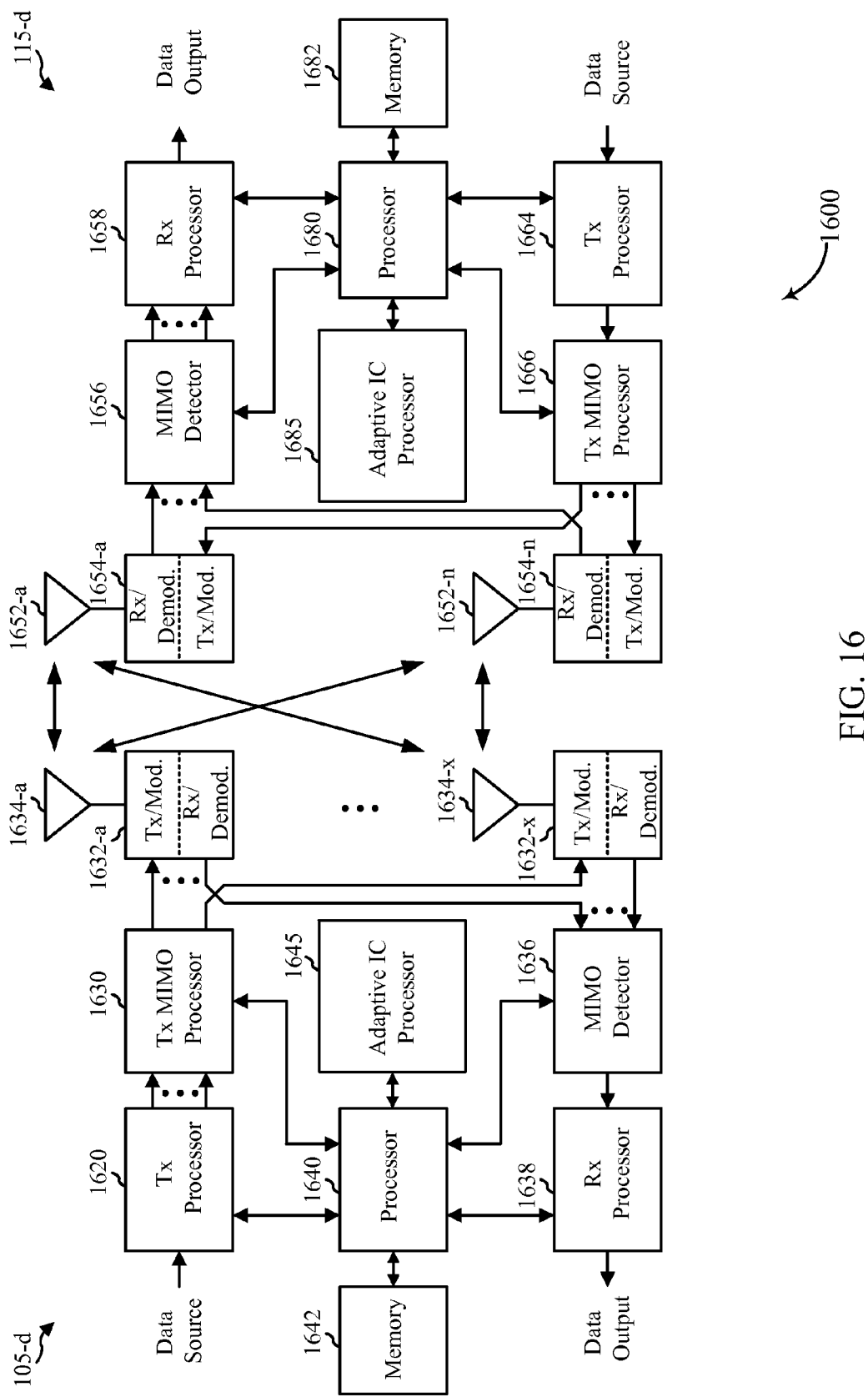
FIG. 16 is a block diagram of a system including a base station and a mobile device.

FIG. 16 is a block diagram of a system 1600 including a base station 105-*d* and a mobile device 115-*d*. This system 1600 may be an example of aspects of the system 100 of FIG. 1 and/or system 200 of FIG. 2. The base station 105-*d* may be equipped with antennas 1634-*a* through 1634-*x*, and the mobile device 115-*d* may be equipped with antennas 1652-*a* through 1652-*n*. Multiple component carriers may carry uplink and downlink transmissions between mobile device 115-*d* and base station 105-*d*.

At the base station 105-*d*, a transmit processor 1620 may receive data from a data source and/or processor 1640. A memory 1642 may be coupled with the processor 1640. The transmit processor 1620 may process the data. The transmit processor 1620 may also generate reference symbols, and a cell-specific reference signal. A transmit (TX) MIMO processor 1630 may perform spatial processing (e.g., precoding) on data symbols, control symbols, and/or reference symbols, if applicable, and may provide output symbol streams to the transmit modulators 1632-*a* through 1632-*x*. Each modulator 1632 may process a respective output symbol stream (e.g., for OFDM, etc.) to obtain an output sample stream. Each modulator 1632 may further process (e.g., convert to analog, amplify, filter, and upconvert) the output sample stream to obtain a downlink (DL) signal. In one example, DL signals from modulators 1632-*a* through 1632-*x* may be transmitted via the antennas 1634-*a* through 1634-*x*, respectively.

The processor 1640 may be coupled with an adaptive IC processor 1645. The adaptive IC processor 1645 may be configured to perform real-time determination of the IC scheme for interfering payloads based on transmission parameters associated with the interfering payloads. The transmission parameters may be used to calculate a signal quality threshold (e.g., SINR threshold, etc.) above which CWIC is likely to be successful for the interfering payload. When performing CWIC, the adaptive IC processor 1645 may monitor a convergence metric to determine if decoding the interfering payload will be successful or not. If non-converging, CWIC may be stopped and a different IC scheme may be run instead. The adaptive IC processor 1645 may take into account the amount of resource overlap between the desired payload and the payload of the interfering payload in determining the IC scheme and/or order of performing interference cancellation for interfering payloads. When performing CWIC, the adaptive IC processor 1645 may determine a number of iterations for iterative decoding of interfering payloads dynamically based on iteration parameters. When CWIC is performed multiple times for an interfering payload, the soft decision output may be stored for the first pass and the iterative decoder may be initialized with the stored soft decision output of the first pass on subsequent passes.

At the mobile device 115-*d*, the mobile device antennas 1652-*a* through 1652-*n* may receive the DL signals and may provide the received signals to the demodulators 1654-*a* through 1654-*n*, respectively. Each demodulator 1654 may condition (e.g., filter, amplify, downconvert, and digitize) a respective received signal to obtain input samples. Each demodulator 1654 may further process the input samples (e.g., for OFDM, etc.) to obtain received symbols. A MIMO detector 1656 may obtain received symbols from all the demodulators 1654-*a* through 1654-*n*, perform MIMO detection on the received symbols if applicable, and provide detected symbols. A receive processor 1658 may process (e.g., demodulate, deinterleave, and decode) the detected symbols, providing decoded data for the mobile device 115-*d* to a data output, and provide decoded control information to a processor 1680, or memory 1682.

An adaptive IC processor 1685 may be coupled to the processor 1680. The adaptive IC processor 1685 may be configured to perform real-time determination of the IC scheme for interfering payloads based on transmission parameters associated with the interfering payloads. The transmission parameters may be used to calculate a signal quality threshold (e.g., SINR threshold, etc.) above which CWIC is likely to be successful for the interfering payload. When performing CWIC, the adaptive IC processor 1685 may monitor a convergence metric to determine if decoding the interfering payload will be successful or not. If non-converging, CWIC may be stopped and a different IC scheme may be run instead. The adaptive IC processor 1685 may take into account the amount of resource overlap between the desired payload and the payload of the interfering payload in determining the IC scheme and/or order of performing interference cancellation for interfering payloads. When performing CWIC, the adaptive IC processor 1685 may determine a number of iterations for iterative decoding of interfering payloads dynamically based on iteration parameters. When CWIC is performed multiple times for an interfering payload, the soft decision output may be stored for the first pass and the iterative decoder may be initialized with the stored soft decision output of the first pass on subsequent passes.

On the uplink (UL), at the mobile device 115-*d*, a transmit processor 1664 may receive and process data from a data source. The transmit processor 1664 may also generate reference symbols for a reference signal. The symbols from the transmit processor 1664 may be precoded by a transmit MIMO processor 1666 if applicable, further processed by the demodulators 1654-*a* through 1654-*n* (e.g., for SC-FDMA, etc.), and be transmitted to the base station 105-*d* in accordance with the transmission parameters received from the base station 105-*d*. At the base station 105-*d*, the UL signals from the mobile device 115-*d* may be received by the antennas 1634, processed by the demodulators 1632, detected by a MIMO detector 1636 if applicable, and further processed by a receive processor 1638. The receive processor 1638 may provide decoded data to a data output and to the processor 1640.

Figure 17:
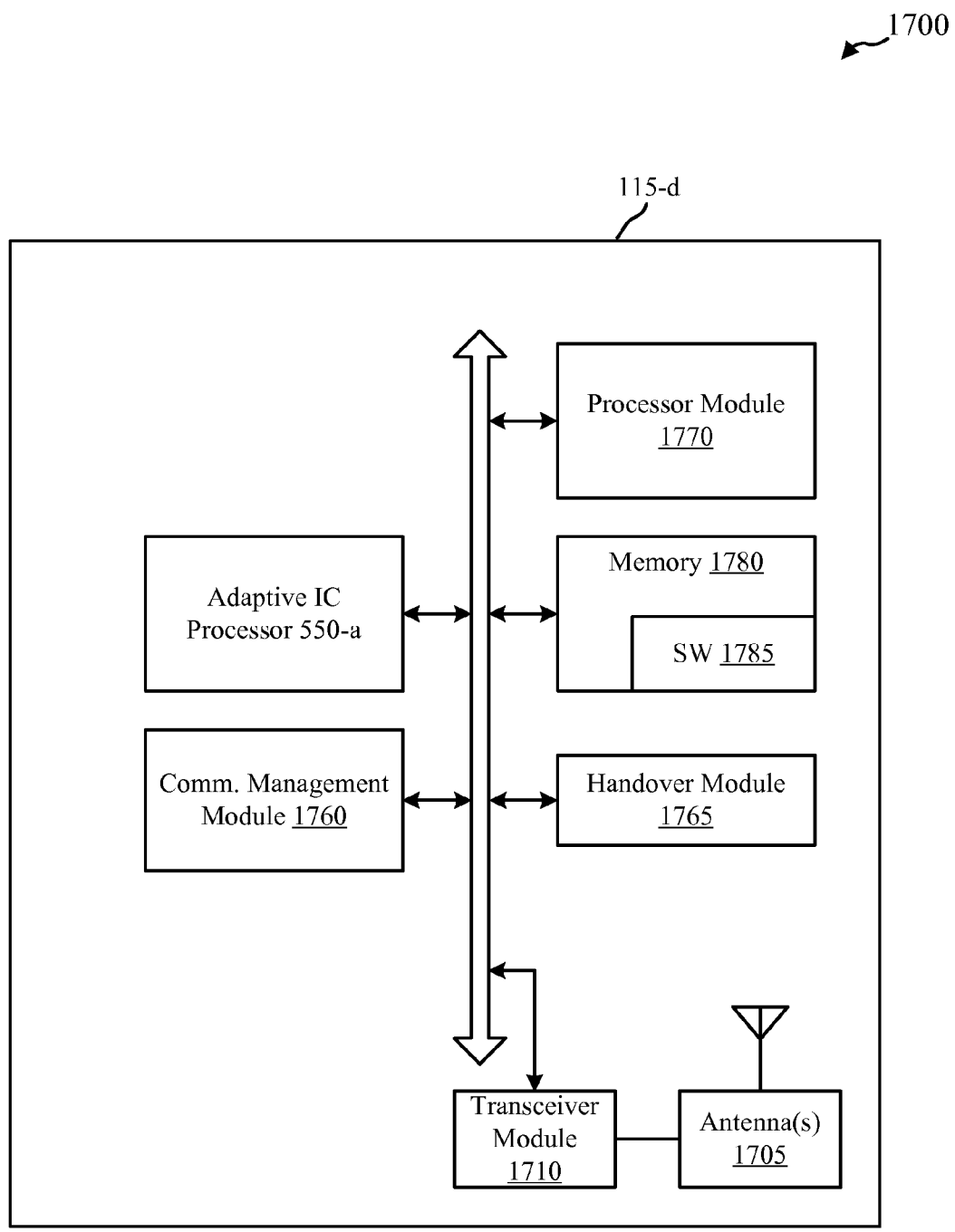
FIG. 17 is a block diagram of a mobile device configured for adaptive interference cancellation in accordance with various embodiments.

FIG. 17 is a block diagram 1700 of a mobile device 115-*d* configured for adaptive interference cancellation in accordance with various embodiments. The mobile device 115-*d* may have any of various configurations, such as personal computers (e.g., laptop computers, netbook computers, tablet computers, etc.), cellular telephones, PDAs, smartphones, digital video recorders (DVRs), internet appliances, gaming consoles, e-readers, etc. The mobile device 115-*d* may have an internal power supply (not shown), such as a small battery, to facilitate mobile operation. In some embodiments, the mobile device 115-*d* may be the mobile devices 115 of FIG. 1 and/or FIG. 2.

The mobile device 115-*d* may generally include components for bi-directional voice and data communications including components for transmitting communications and components for receiving communications. The mobile device 115-*d* may include a transceiver module 1710, antenna(s) 1705, memory 1780, and a processor module 1770, which each may communicate, directly or indirectly, with each other (e.g., via one or more buses). The transceiver module 1710 is configured to communicate bi-directionally, via the antenna(s) 1705 and/or one or more wired or wireless links, with one or more networks, as described above. For example, the transceiver module 1710 may be configured to communicate bi-directionally with access points including eNBs 105. The transceiver module 1710 may include a modem configured to modulate the packets and provide the modulated packets to the antenna(s) 1705 for transmission, and to demodulate packets received from the antenna(s) 1705. While the mobile device 115-*d* may include a single antenna 1705, the mobile device 115-*a* may have multiple antennas 1705 capable of concurrently transmitting and/or receiving multiple wireless transmissions. The transceiver module 1710 may be capable of concurrently communicating with multiple eNBs 105 via multiple component carriers.

The memory 1780 may include random access memory (RAM) and read-only memory (ROM). The memory 1780 may store computer-readable, computer-executable software/firmware code 1785 containing instructions that are configured to, when executed, cause the processor module 1770 to perform various functions described herein (e.g., call processing, database management, network assisted acquisition of neighbor cell signals, etc.). Alternatively, the software/firmware code 1785 may not be directly executable by the processor module 1770 but be configured to cause a computer (e.g., when compiled and executed) to perform functions described herein.

The processor module 1770 may include an intelligent hardware device, e.g., a central processing unit (CPU) such as those made by Intel® Corporation or AMD®, a microcontroller, an application-specific integrated circuit (ASIC), etc. The mobile device 115-*d* may include a speech encoder (not shown) configured to receive audio via a microphone, convert the audio into packets (e.g., 20 ms in length, 30 ms in length, etc.) representative of the received audio, provide the audio packets to the transceiver module 1710, and provide indications of whether a user is speaking.

According to the architecture of FIG. 17, the mobile device 115-*d* may further include communications management module 1760, handover module 1765, and adaptive IC processor 550-*a*. By way of example, these modules may be components of the mobile device 115-*d* in communication with some or all of the other components of the mobile device 115-*d* via a bus. Alternatively, functionality of these modules may be implemented as a component of the transceiver module 1710, as a computer program product, and/or as one or more controller elements of the processor module 1770.

In some embodiments, handover module 1765 may be utilized to perform handover procedures of the mobile device 115-*d* from one eNB 105 to another. For example, the handover module 1765 may perform a handover procedure of the mobile device 115-*d* from one base station to another where voice and/or data communications are being received from the base stations.

The mobile device 115-*d* may be configured to perform adaptive interference cancellation as described above. The components for mobile device 115-*d* may be configured to implement aspects discussed above with respect to UEs 115 of FIG. 1 or FIG. 2, and/or devices 1400 and/or 1500 of FIG. 14 or FIG. 15. For example, the adaptive IC processor 550-*a* may be an example of the adaptive IC processor 550 of FIG. 5 or devices 1400 and/or 1500 of FIG. 14 or FIG. 15.

Figure 18:
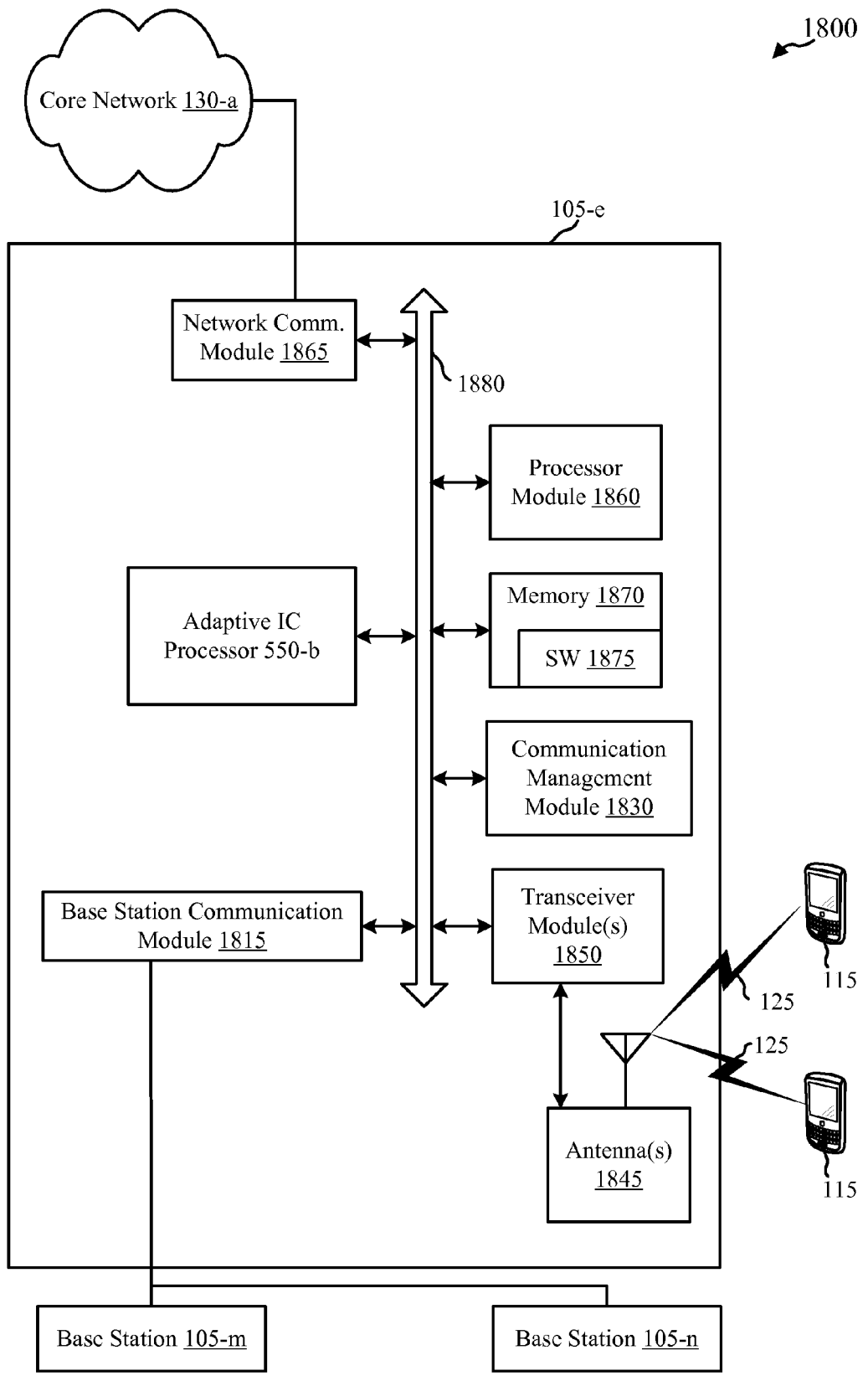
FIG. 18 shows a block diagram of a communications system that may be configured for adaptive interference cancellation in accordance with various embodiments.

FIG. 18 shows a block diagram of a communications system 1800 that may be configured for adaptive interference cancellation in accordance with various embodiments. This system 1800 may be an example of aspects of the system 100 or system 200 depicted in FIG. 1 or FIG. 2. The system 1800 includes a base station 105-*d* configured for communication with UEs 115 over wireless communication links 125.

In some cases, the base station 105-*e* may have one or more wired backhaul links. Base station 105-*e* may have, for example, a wired backhaul link (e.g., S1 interface, etc.) to the core network 130-*a*. Base station 105-*e* may also communicate with other eNBs 105, such as base station 105-*m* and base station 105-*n* via inter-base station communication links (e.g., X2 interface, etc.). Each of the base stations 105 may communicate with UEs 115 using different wireless communications technologies, such as different Radio Access Technologies. In some cases, base station 105-*e* may communicate with other base stations such as 105-*m* and/or 105-*n* utilizing base station communication module 1815. In some embodiments, base station communication module 1815 may provide an X2 interface within an LTE/LTE-A wireless communication network technology to provide communication between some of the base stations 105, 135. In some embodiments, base station 105-*e* may communicate with other base stations through core network 130-*a*. In some cases, the base station 105-*e* may communicate with the core network 130-*a* through network communications module 1865.

The components for base station 105-*e* may be configured to implement aspects discussed above with respect to base stations 105 of FIG. 1, FIG. 2, or FIG. 16 and/or devices 1400 and/or 1500 of FIG. 14 or FIG. 15 and may not be repeated here for the sake of brevity. For example, the adaptive IC processor 550-*b* may be an example of the adaptive IC processor 550 of FIG. 5 or devices 1400 and/or 1500 of FIG. 14 or FIG. 15.

The base station 105-*e* may include antennas 1845, transceiver modules 1850, memory 1870, and a processor module 1860, which each may be in communication, directly or indirectly, with each other (e.g., over bus system 1880). The transceiver modules 1850 may be configured to communicate bi-directionally, via the antennas 1845, with the UEs 115, which may be multi-mode devices. The transceiver module 1850 (and/or other components of the base station 105-*e*) may also be configured to communicate bi-directionally, via the antennas 1845, with one or more other base stations (not shown). The transceiver module 1850 may include a modem configured to modulate the packets and provide the modulated packets to the antennas 1845 for transmission, and to demodulate packets received from the antennas 1845. The base station 105-*e* may include multiple transceiver modules 1850, each with one or more associated antennas 1845.

The memory 1870 may include random access memory (RAM) and read-only memory (ROM). The memory 1870 may also store computer-readable, computer-executable software code 1875 containing instructions that are configured to, when executed, cause the processor module 1860 to perform various functions described herein (e.g., call processing, database management, generation of assistance information and/or interference cancellation information, etc.). Alternatively, the software 1875 may not be directly executable by the processor module 1860 but be configured to cause the computer, e.g., when compiled and executed, to perform functions described herein.

The processor module 1860 may include an intelligent hardware device, e.g., a central processing unit (CPU) such as those made by Intel® Corporation or AMD®, a microcontroller, an application-specific integrated circuit (ASIC), etc. The processor module 1860 may include various special purpose processors such as encoders, queue processing modules, base band processors, radio head controllers, digital signal processors (DSPs), and the like.

According to the architecture of FIG. 18, the base station 105-*a* may further include a communications management module 1830. The communications management module 1830 may manage communications with other eNBs 105. The communications management module may include a controller and/or scheduler for controlling communications with UEs 115 in cooperation with other eNBs 105. For example, the communications management module 1830 may perform scheduling for transmissions to UEs 115 and/or various interference mitigation techniques such as beamforming and/or joint transmission.

The components of the devices 1400 or 1500, the UEs 115, or the base stations 105 may, individually or collectively, be implemented with one or more application-specific integrated circuits (ASICs) adapted to perform some or all of the applicable functions in hardware. Alternatively, the functions may be performed by one or more other processing units (or cores), on one or more integrated circuits. In other embodiments, other types of integrated circuits may be used (e.g., Structured/Platform ASICs, Field Programmable Gate Arrays (FPGAs), and other Semi-Custom ICs), which may be programmed in any manner known in the art. The functions of each unit may also be implemented, in whole or in part, with instructions embodied in a memory, formatted to be executed by one or more general or application-specific processors.

The detailed description set forth above in connection with the appended drawings describes exemplary embodiments and does not represent the only embodiments that may be implemented or that are within the scope of the claims. The term "exemplary" used throughout this description means "serving as an example, instance, or illustration," and not "preferred" or "advantageous over other embodiments." The detailed description includes specific details for the purpose of providing an understanding of the described techniques. These techniques, however, may be practiced without these specific details. In some instances, well-known structures and devices are shown in block diagram form in order to avoid obscuring the concepts of the described embodiments.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an application-specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The functions described herein may be implemented in hardware, software/firmware, or combinations thereof. If implemented in software/firmware, the functions may be stored on or transmitted over as one or more instructions or code on a computer-readable medium. Other examples and implementations are within the scope and spirit of the disclosure and appended claims. For example, due to the nature of software/firmware, functions described above can be implemented using software/firmware executed by, e.g., a processor, hardware, hardwiring, or combinations thereof. Features implementing functions may also be physically located at various positions, including being distributed such that portions of functions are implemented at different physical locations.

Computer-readable media includes both computer storage media and communication media including any medium that facilitates transfer of a computer program from one place to another. A storage medium may be any available medium that can be accessed by a general-purpose or special-purpose computer. By way of example, and not limitation, computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software/firmware is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the generic principles defined herein may be applied to other variations without departing from the spirit or scope of the disclosure. Throughout this disclosure the term "example" or "exemplary" indicates an example or instance and does not imply or require any preference for the noted example. Thus, the disclosure is not to be limited to the examples and designs described herein but is to be accorded the widest scope consistent with the principles and novel features disclosed herein.

What is claimed is:

1. A method, comprising:
    receiving a signal comprising a serving cell transmission and one or more interfering transmissions in a time interval;
    detecting a first interfering transmission and a second interfering transmission from the one or more interfering transmissions received in the time interval;
    determining amounts of respective frequency resource overlap of the first and second interfering transmissions with respect to the serving cell transmission within the time interval; and
    determining an order for performing interference cancellation for the first and the second interfering transmissions based on a comparison of a first amount of overlapping signal energy of the first interfering transmission with a second amount of overlapping signal energy of the second interfering transmission, the first and second amounts of overlapping signal energy being determined based on respective signal energies of the first and second interfering transmissions and the determined amounts of respective frequency resource overlap of the first and second interfering transmissions.

2. The method of claim 1, wherein the at least one of the first or the second interfering transmissions comprises one or more of an interfering neighboring cell transmission or an interfering serving cell transmission.

3. The method of claim 1, further comprising:
    identifying a transmission parameter for the at least one of the first or the second interfering transmissions; and
    determining an interference cancellation scheme for at least one of the first or the second interfering transmissions based at least in part on a signal quality metric associated with the at least one of the first or the second interfering transmissions,
    wherein the interference cancellation scheme is determined based at least in part on comparing the signal quality metric to a signal quality threshold, and wherein the signal quality threshold is based at least in part on the identified transmission parameter.

4. The method of claim 3, wherein the signal quality threshold comprises a signal to interference plus noise ratio (SINK) threshold, and wherein the signal quality metric comprises a SINR of the at least one of the first or the second interfering transmissions.

5. The method of claim 3, wherein the interference cancellation scheme comprises one or more of spatial interference rejection based on linear equalization, an error correcting code structure based interference cancellation scheme, or a coding structure independent interference cancellation scheme, or a combination thereof.

6. The method of claim 3, wherein the interference cancellation scheme is determined based at least in part on the determined amount of frequency resource overlap.

7. The method of claim 3, further comprising:
    performing codeword-level interference cancellation (CWIC) for the at least one of the first or the second interfering transmissions based on the signal quality metric of the at least one of the first or the second interfering transmissions exceeding the signal quality threshold.

8. The method of claim 7, wherein performing CWIC for the at least one of the first or the second interfering transmissions comprises:
    performing iterative decoding of the at least one of the first or the second interfering transmissions;

monitoring a convergence metric of the iterative decoding;
determining a convergence estimate based at least in part on the convergence metric and a number of iterations of the iterative decoding; and
discontinuing CWIC of the at least one of the first or the second interfering transmissions when the convergence estimate indicates that the iterative decoding is not converging.

9. The method of claim 7, further comprising:
performing symbol-level interference cancellation (SLIC) for the at least one of the first or the second interfering transmissions after discontinuing CWIC.

10. The method of claim 3, further comprising:
performing symbol-level interference cancellation (SLIC) for the at least one of the first or the second interfering transmissions based on the signal quality metric of the at least one of the first or the second interfering transmissions not exceeding the signal quality threshold.

11. The method of claim 3, further comprising:
performing no interference cancellation for the at least one of the first or the second interfering transmissions based on the signal quality metric of the at least one of the first or the second interfering transmissions not exceeding a second signal quality threshold.

12. The method of claim 3, wherein the identifying the transmission parameter for the at least one of the first or the second interfering transmissions comprises at least one of:
receiving the transmission parameter at a user equipment (UE) in a control message intended for the UE; or
blind decoding of downlink control information (DCI) associated with the at least one of the first or the second interfering transmissions.

13. The method of claim 3, wherein the transmission parameter comprises one or more of a code rate of the at least one of the first or the second interfering transmissions, a spatial scheme of the at least one of the first or the second interfering transmissions, a rank of transmissions associated with the at least one of the first or the second interfering transmissions, a transport block size of the at least one of the first or the second interfering transmissions, a redundancy version of the at least one of the first or the second interfering transmissions, or a combination thereof.

14. The method of claim 3, further comprising:
performing codeword-level interference cancellation (CWIC) for the at least one of the first or the second interfering transmissions, wherein performing CWIC corresponds to a portion of resources of the serving cell transmission, the method further comprising:
performing a different interference cancellation scheme on a remaining portion of resources of the serving cell transmission.

15. The method of claim 1, wherein determining the order for performing interference cancellation for the first and the second interfering transmissions is based on an estimated probability of successfully decoding the first and the second interfering transmissions.

16. A device for performing adaptive interference cancellation, comprising:
a processor; and
a memory in electronic communication with the processor, the memory embodying instructions, the instructions being executable by the processor to:
receive a signal comprising a serving cell transmission and one or more interfering transmissions in a time interval;
detect a first interfering transmission and a second interfering transmission from the one or more interfering transmissions received in the time interval;
determine amounts of respective frequency resource overlap of the first and second interfering transmissions with respect to the serving cell transmission within the time interval; and
determine an order for performing interference cancellation for the first and the second interfering transmissions based on a comparison of a first amount of overlapping signal energy of the first interfering transmission with the serving cell transmission with a second amount of overlapping signal energy of the second interfering transmission with the serving cell transmission, the first and second amounts of overlapping signal energy being determined based on respective signal energies of the first and second interfering transmissions and the determined amounts of respective frequency resource overlap of the first and second interfering transmissions.

17. The device of claim 16, the memory further comprising instructions being executable by the processor to:
identify a transmission parameter for the at least one of the first or the second interfering transmissions; and
determine an interference cancellation scheme for at least one of the first or the second interfering transmissions based at least in part on a signal quality metric associated with the at least one of the first or the second interfering transmissions,
wherein the interference cancellation scheme is determined based at least in part on comparing the signal quality metric to a signal quality threshold, and wherein the signal quality threshold is based at least in part on the identified transmission parameter.

18. The device of claim 17, wherein the interference cancellation scheme is determined based at least in part on the determined amount of frequency resource overlap.

19. The device of claim 17, the memory further comprising instructions being executable by the processor to:
perform codeword-level interference cancellation (CWIC) for the at least one of the first or the second interfering transmissions based on the signal quality metric of the at least one of the first or the second interfering transmissions exceeding the signal quality threshold;
perform iterative decoding of the at least one of the first or the second interfering transmissions;
monitor a convergence metric of the iterative decoding;
determine a convergence estimate based at least in part on the convergence metric and a number of iterations of the iterative decoding; and
discontinue CWIC of the at least one of the first or the second interfering transmissions when the convergence estimate indicates that the iterative decoding is not converging.

20. The device of claim 17, the memory further comprising instructions being executable by the processor to:
perform symbol-level interference cancellation (SLIC) for the at least one of the first or the second interfering transmissions based on the signal quality metric of the at least one of the first or the second interfering transmissions not exceeding the signal quality threshold.

21. The device of claim 16, wherein the determined order for performing interference cancellation for the first and the second interfering transmissions is based on an estimated probability of successfully decoding the first and the second interfering transmissions.

22. A device for performing adaptive interference cancellation, comprising:
    means for receiving a signal comprising a serving cell transmission and one or more interfering transmissions in a time interval;
    means for detecting a first interfering transmission and a second interfering transmission from the one or more interfering transmissions received in the time interval;
    means for determining amounts of respective frequency resource overlap of the first and second interfering transmissions with respect to the serving cell transmission within the time interval and
    means for determining an order for performing interference cancellation for the first and the second interfering transmissions based on a comparison of a first amount of overlapping signal energy of the first interfering transmission with the serving cell transmission with a second amount of overlapping signal energy of the second interfering transmission with the serving cell transmission, the first and second amounts of overlapping signal energy being determined based on respective signal energies of the first and second interfering transmissions and the determined amounts of respective frequency resource overlap of the first and second interfering transmissions.

23. The device of claim 22, further comprising:
    means for identifying a transmission parameter for the at least one of the first or the second interfering transmissions; and
    means for determining an interference cancellation scheme for at least one of the first or the second interfering transmissions based at least in part on a signal quality metric associated with the at least one of the first or the second interfering transmissions,
    wherein the interference cancellation scheme is determined based at least in part on comparing the signal quality metric to a signal quality threshold, and wherein the signal quality threshold is based at least in part on the identified transmission parameter.

24. The device of claim 23, wherein the interference cancellation scheme is determined based at least in part on the determined amount of frequency resource overlap.

25. The device of claim 23, further comprising:
    means for performing codeword-level interference cancellation (CWIC) for the at least one of the first or the second interfering transmissions based on the signal quality metric of the at least one of the first or the second interfering transmissions exceeding the signal quality threshold;
    means for performing iterative decoding of the at least one of the first or the second interfering transmission;
    means for monitoring a convergence metric of the iterative decoding;
    means for determining a convergence estimate based at least in part on the convergence metric and a number of iterations of the iterative decoding; and
    means for discontinuing CWIC of the at least one of the first or the second interfering transmissions when the convergence estimate indicates that the iterative decoding is not converging.

26. The device of claim 23, further comprising:
    means for performing symbol-level interference cancellation (SLIC) for the at least one of the first or the second interfering transmissions based on the signal quality metric of the at least one of the first or the second interfering transmissions not exceeding the signal quality threshold.

27. The device of claim 22, wherein the determined order for performing interference cancellation for the first and the second interfering transmissions is based on an estimated probability of successfully decoding the first and the second interfering transmissions.

28. A non-transitory computer-readable medium storing code for performing adaptive interference cancellation, the code comprising instructions for:
    receiving a signal comprising a serving cell transmission and one or more interfering transmissions in a time interval;
    detecting a first interfering transmission and a second interfering transmission from the one or more interfering transmissions received in the time interval;
    determining amounts of respective frequency resource overlap of the first and second interfering transmissions with respect to the serving cell transmission within the time interval; and
    determining an order for performing interference cancellation for the first and the second interfering transmissions based on a comparison of a first amount of overlapping signal energy of the first interfering transmission with the serving cell transmission with a second amount of overlapping signal energy of the second interfering transmission with the serving cell transmission, the first and second amounts of overlapping signal energy being determined based on respective signal energies of the first and second interfering transmissions and the determined amounts of respective frequency resource overlap of the first and second interfering transmissions.

29. The non-transitory computer-readable medium of claim 28, the code further comprising instructions for:
    identifying a transmission parameter for at least one of the first or the second interfering transmissions; and
    determining an interference cancellation scheme for at least one of the first or the second interfering transmissions based at least in part on a signal quality metric associated with the at least one of the first or the second interfering transmissions,
    wherein the interference cancellation scheme is determined based at least in part on comparing the signal quality metric to a signal quality threshold, and wherein the signal quality threshold is based at least in part on the identified transmission parameter.

* * * * *